(12) United States Patent
Takemori et al.

(10) Patent No.: US 7,102,182 B2
(45) Date of Patent: Sep. 5, 2006

(54) SEMICONDUCTOR DEVICE

(75) Inventors: Toshiyuki Takemori, Hanno (JP); Masato Itoi, Hanno (JP); Yuji Watanabe, Hidaka (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/481,016

(22) PCT Filed: Nov. 27, 2002

(86) PCT No.: PCT/JP02/12384

§ 371 (c)(1),
(2), (4) Date: Dec. 17, 2003

(87) PCT Pub. No.: WO03/046999

PCT Pub. Date: Jun. 5, 2003

(65) Prior Publication Data

US 2004/0169220 A1   Sep. 2, 2004

(30) Foreign Application Priority Data

Nov. 30, 2001   (JP) ........................ 2001-365641

(51) Int. Cl.
*H01L 29/792*   (2006.01)

(52) U.S. Cl. .................... 257/271; 257/326; 257/328
(58) Field of Classification Search ................ 257/271, 257/326–332, 333, 335, 192; 438/710, 197, 438/190, 241, 258, 266, 259, 270, 589, 212, 438/271, 221, 430, 268, 337
See application file for complete search history.

(56) References Cited

U.S. PATENT DOCUMENTS

| | | | | |
|---|---|---|---|---|
| 5,693,569 A | 12/1997 | Ueno | ........................ | 437/203 |
| 5,801,417 A | 9/1998 | Tsang et al. | ................. | 257/333 |
| 6,110,799 A | 8/2000 | Huang | | |
| 6,144,067 A | 11/2000 | Kinzer | ........................ | 257/335 |
| 6,188,105 B1 * | 2/2001 | Kocon et al. | ................ | 257/330 |
| 6,395,604 B1 * | 5/2002 | Kubo et al. | ................. | 438/270 |
| 6,445,035 B1 * | 9/2002 | Zeng et al. | .................. | 257/329 |
| 2001/0009800 A1 | 7/2001 | Hijzen et al. | ................ | 438/589 |
| 2004/0012051 A1 | 1/2004 | Matsuda et al. | | |

FOREIGN PATENT DOCUMENTS

| | | |
|---|---|---|
| DE | 199118198 | 4/1989 |
| EP | 0 747 967 A2 | 12/1996 |

(Continued)

OTHER PUBLICATIONS

Search Report for PCT/JP02/12384, Mar. 11, 2003.
Office Action in DE 102 96 970.1–33, Jun. 2, 2005 and English Translation.

*Primary Examiner*—Carl Whitehead, Jr.
*Assistant Examiner*—Yennhu B. Huynh
(74) *Attorney, Agent, or Firm*—Nixon & Vanderhye, PC

(57) ABSTRACT

An example semiconductor device is capable of preventing a buried diffusion region formed near the bottom surface of a source trench from diffusing to the extent that it contacts a gate trench in the vicinity of that buried diffusion region even if the accuracy of the photographic step of trench formation is not so high. A side wall is formed on the circumferential side of the source trench and then impurities are injected to the bottom surface of the source trench. When the impurities are heated and diffused, the buried $P^+$-type diffusion region is formed with a width almost identical to the width of the opening of the source trench or smaller than the width of the opening of the source trench. Thus, even when irregularities are generated in the manufacturing step and the buried diffusion region becomes larger than is necessary, it is possible to prevent contact of the buried diffusion region with the gate trench.

21 Claims, 20 Drawing Sheets

FOREIGN PATENT DOCUMENTS

| | | |
|---|---|---|
| EP | 0 923 137 A2 | 11/1998 |
| EP | 0889511 | 1/1999 |
| EP | 1041638 | 10/2000 |
| GB | 2336721 | 10/1999 |
| JP | 1234613 | 9/1989 |
| JP | 11-087710 | 3/1999 |
| JP | 11-354794 | 12/1999 |
| JP | 2000-307115 | 11/2000 |
| JP | 2001-094101 | 4/2001 |
| JP | 2001-284586 | 10/2001 |

* cited by examiner

SEMICONDUCTOR DEVICE

This application is the US national phase of international application PCT/JP02/12384, filed 27 Nov. 2002, which designated the U.S. PCT/JP02/12384 claims priority to JP Application No. 2001-365641 filed 30 Nov. 2001. The entire contents of these applications are incorporated herein by reference.

TECHNICAL FIELD

The present invention relates to a semiconductor device and manufacturing method thereof, and more particularly, to a semiconductor device having the constitution of a power MOSFET used in a power supply circuit and so forth, and a manufacturing method thereof.

BACKGROUND ART

Power MOSFET semiconductor devices having a trench gate have recently been applied to a wide range of various types of power supply devices such as DC-DC converters. An example of this type of semiconductor device is shown in FIGS. 38A and 38B. FIGS. 38A and 38B are explanatory views showing an example of a semiconductor device having the constitution of a power MOSFET pertaining to the prior art, with 38A being a view showing an example of a semiconductor device having a gate trench, and 38B being a view showing an example of a semiconductor device having a gate trench and a source trench. In the figures, reference symbol 111 indicates a N$^+$-type silicon substrate, 112 indicates a N$^-$-type epitaxial layer, 113 indicates a P-type body layer, 114 and 143 indicate source trenches, 115 indicates an N$^+$-type source region, 116 indicates a gate insulating film, 117 indicates a gate electrode film, 119 indicates a source electrode film, 120 indicates a gate trench, 121 indicates a P$^+$-type diffusion region, 125 indicates a drain electrode film, 126 indicates an insulating film, 140 and 142 indicate buried P$^+$-type diffusion regions, and 141 indicates an insulating film.

As shown, for example, in FIG. 38A, a semiconductor device like that described above forms a drain layer in the form of N$^-$-type epitaxial layer 112 on N$^+$-type silicon substrate 111, and forms P-type body layer 113 on N$^-$-type epitaxial layer 112. P$^+$-type diffusion region 121 and N$^+$-type source region 115 are formed within P-type body region 113. P$^+$-type diffusion region 121 and N$^+$-type source region 115 comprise a single cell. A large number of such cells are formed, and are arranged in the form of a lattice or staggered lattice in a planar constitution. Alternatively, P$^+$-type diffusion region 121 and N$^+$-type source region 115 are formed into a striped pattern by continuing the cross-sectional structure shown in FIG. 38A.

Moreover, gate trench 120 is formed extending to N$^-$-type epitaxial layer 112 through P-type body layer 113. Gate insulating film 116 is formed and closely adhered to the top surface and bottom surface of gate trench 120, and gate electrode film 117 is formed in the space surrounded by gate insulating film 116. In addition, insulating film 126 is formed so as to cover gate insulating film 116 and gate electrode film 117, and a separate insulating film 141 is formed on the surface of N$^+$-type source region 115 and insulating film 126.

Moreover, source electrode film 119 is formed on insulating film 141 and P$^+$-type diffusion region 121, and on a portion of N$^+$-type source region 115. In addition, drain electrode film 125 is formed on the other side of N$^+$-type silicon substrate 111.

In this semiconductor device, when a voltage is applied between source electrode film 119 and drain electrode film 125, and a voltage greater than or equal to a predetermined threshold value is applied between gate electrode film 117 and source electrode film 119, an inversion layer is formed in the boundary region with gate insulating film 116 of P-type body layer 113 that serves as a channel. Current then flows through this channel from drain electrode film 125 to source electrode film 119.

However, in a semiconductor device having this type of constitution, in the case of attempting to reduce the size of the device, it is necessary to make the cell size smaller by reducing mesa width E. Therefore, the structure shown in FIG. 38B is known as a way to reduce cell size. Namely, a source trench 114 is formed within the cell, and a source electrode film 119 is formed within source trench 114. Moreover, a structure is also known in which, after injecting impurities such as boron in the vicinity of the bottom of source trench 114, those impurities are heated and diffused to form buried P$^+$-type diffusion region 140. According to this structure, as a result of a portion of source electrode film 119 being buried in source trench 114, mesa width F can be made to be smaller than mesa width E of FIG. 38A.

However, when cell size is made considerably smaller, due to limitations on the accuracy of the photographic step of trench formation, the source trench is not formed at a predetermined location, but rather as indicated for source trench 143, for example, is frequently formed in close proximity to gate trench 120. In such cases, when a certain degree of variation occurs in the diffusion range of buried P$^+$-type diffusion region 140, there is diffusion to the extent to contact gate insulating film 116 as indicated for buried P$^+$-type diffusion region 142. Since buried P$^+$-type diffusion region 142 ends up being formed so as to be interposed P-type body layer 113 and N$^+$-type source region 115, a shift occurs in the predetermined threshold value previously mentioned.

In order to solve the aforementioned problems, an object of the present invention is to provide a semiconductor device capable of preventing a buried diffusion region formed near the bottom surface of a source trench from diffusing to the extent that it contacts a gate trench in the vicinity of that buried diffusion region even in the case the accuracy of the photographic step of trench formation is not that high.

TECHNICAL PROBLEM AND ITS SOLUTION

In order to solve the aforementioned problems, the present invention is comprised of:

a first conductive layer of a first conductive type, a first conductive type of drain layer formed so as to be laminated on the surface of the first conductive type of first conductive layer, a second conductive type of second conductive layer of the opposite type of the first conductive type formed so as to be laminated on the surface of the drain layer, a first conductive type of source region formed over a range extending from the surface of the second conductive layer to a predetermined depth, a first trench opened in the source region and formed so as to reach to the drain layer, a second trench formed to be opened in the source region, a gate insulating film formed on the surface of the first trench, a gate electrode film formed on the inner surface of the gate insulating film, a source electrode film formed at least on the surface of the second trench, and a second conductive type of buried diffusion region formed within the second conductive layer, exposed on the bottom surface of the second trench, and to a width that is equal to or narrower than the width of the opening section of the second trench.

Thus, since the semiconductor device according to the present invention forms a buried diffusion region exposed on the bottom surface of a second trench to a width that is equal to or narrower than the width of the opening section of the second trench, the buried diffusion region can be prevented from contacting a first trench in the vicinity of said buried diffusion region even in the case variation occurs in the size of the buried diffusion region. Moreover, a buried diffusion region in which the buried diffusion region has diffused beyond that which is necessary in the manufacturing step of a semiconductor device can also be prevented from contacting a first trench in the vicinity of said buried diffusion region even in the case the accuracy of the photographic step of the formation of the first or second trench is not so high.

In addition, in the aforementioned semiconductor device, the second trench can be formed so as to reach to the second conductive layer.

Moreover, in the aforementioned semiconductor device, the second trench can be formed with its inner peripheral surface on an incline.

In addition, in the aforementioned semiconductor device, the second trench can be formed to have an indentation in its inner surface.

In addition, in a manufacturing method of a semiconductor device, the present invention comprises: forming a first insulating film on the surface of a first conductive type of drain layer formed so as to be laminated on the surface of a first conductive type of first conductive layer, opening a predetermined site of the first insulating film to expose the drain layer, opening the drain layer to form a first trench, removing the first insulating film, forming a second insulating film on the surface of the drain layer and on the surface of the first trench, forming a gate electrode film on the inner surface of the second insulating film formed within the first trench, removing the section formed on the surface of the drain layer and a portion of the section formed on the surface of the first trench of the second insulating film, forming a third insulating film on the surface of the drain layer, on the surface of the first trench, and on the surface of the exposed sections of the second insulating film and the gate electrode film, forming a second conductive type of a second conductive layer of the opposite type from the first conductive type over a range extending from the surface of the drain layer to a predetermined depth, forming a first conductive type of source region over the range extending from the surface of the second conductive layer to a predetermined depth, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, injecting impurities into the section of the second conductive layer beneath the bottom surface of the second trench, forming a second conductive type of buried diffusion region by heating and diffusing the impurities, removing the fifth insulating film, and forming a source electrode film on the surface of the fourth insulating film and on the surface of the second trench.

Thus, since impurities are injected into a section beneath the bottom surface of a second trench after forming a fifth insulating film on the surface of the second trench, the surface area of the region into which impurities are injected can be made smaller by the amount of the film thickness of the fifth insulating film formed on the peripheral surface of the second trench.

In addition, in a manufacturing method of a semiconductor device, the present invention comprises: forming a second conductive layer of a second conductive type that is the opposite type from a first conductive type over a range extending from the surface of a first conductive type of drain layer of a semiconductor substrate to a predetermined depth, said semiconductor substrate comprising said drain layer formed over a range from one of the main sides to a predetermined depth, forming a first conductive type of a source region over the range extending from the surface of the second conductive layer to a predetermined depth, forming a first insulating film on the surface of the source region, opening a predetermined site in the first insulating film to expose the source region, opening the exposed source region to form a first trench extending to the drain layer, removing the first insulating film, forming a second insulating film on the surface of the source region and on the surface of the first trench, forming a gate electrode film on the surface of the second insulating film formed within the first trench, removing the section of the second insulating film formed on the surface of the source region and removing a portion of the section of the second insulating film formed on the surface of the first trench, forming a third insulating film on the surface of the source region, the surface of the first trench and the surface of the exposed sections of the second insulating film and the gate electrode film, forming a fourth insulating film on the surface of the third insulating film, opening predetermined sites in the third insulating film and the fourth insulating film to expose the source region, opening the exposed source region to form a second trench reaching to the second conductive layer, forming a fifth insulating film on the surface of the fourth insulating film and on the surface of the second trench, injecting impurities into the section of the second conductive layer below the bottom surface of the second trench, forming a second conductive type of buried diffusion region by heating and diffusing the impurities, removing the firth insulating film, and forming a source electrode film on the surface of the fourth insulating film and the surface of the second trench.

Thus, since impurities are injected into the section below the bottom surface of the second trench after forming a fifth insulating film on the surface of the second trench, the surface area of the region into which impurities are injected can be made smaller by the amount of the film thickness of the fifth insulating film formed on the peripheral surface of the second trench.

In addition, in a manufacturing method of a semiconductor device, the present invention comprises: forming a second conductive layer of a second conductive type that is the opposite type from a first conductive type over a range extending from the surface of a first conductive type of drain layer formed so as to be laminated onto the surface of a first conductive type of first conductive layer to a predetermined depth, forming a first conductive type of source region over a range extending from the surface of the second conductive layer to a predetermined depth, forming a first insulating film on the surface of the source region, opening a predetermined site in the first insulating film to expose the source region, opening the exposed source region to form a first trench so as to extend to the drain layer, removing the first insulating film, forming a second insulating film on the surface of the source region and on the surface of the first trench, forming a gate electrode film on the inner surface of the second insulating film formed within the first trench, removing the section of the second insulating film formed on the surface of the source region and a portion of the section of the second insulating film formed on the surface of the first trench, forming a third insulating film on the surface of the source region, the surface of the first trench, and on the surface of exposed sections of the second insulating film and the gate electrode film, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, injecting impurities into the section of the second conductive layer below the bottom surface of the second trench, forming a second conductive type of buried diffusion region by heating and diffusing the impurities, removing the fifth insulating film, and forming a source electrode film on the surface of the fourth insulating film and on the surface of the second trench.

Thus, similar to the previously described manufacturing method of a semiconductor device, since impurities are injected into the section below the bottom surface of the second trench after forming a fifth insulating film on the surface of the second trench, the surface area of the region into which impurities are injected can be made smaller by the amount of the film thickness of the fifth insulating film formed on the peripheral surface of the second trench.

In addition, in a manufacturing method of a semiconductor device, the present invention comprises: forming a first insulating film on the surface of a first conductive type of drain layer formed so as to be laminated onto the surface of a first conductive type of first conductive layer, opening a predetermined site in the first insulating film to expose the drain layer, opening the exposed second conductive layer to form a first trench, removing the first insulating film, forming a second insulating film on the surface of the second conductive layer and on the surface of the first trench, forming a gate electrode film on the inner surface of the second insulating film formed within the first trench, removing the section of the second insulating film formed on the surface of the drain layer and a portion of the section of the second insulating film formed on the surface of the first trench, forming a third insulating film on the surface of the drain layer, the surface of the first trench and on the surface of the exposed sections of the second insulating film and the gate electrode film, forming a second conductive layer of a second conductive type opposite from the first conductive type over a range extending from the surface of the drain layer to a predetermined depth, forming a first conductive type of source region over a range extending from the surface of the second conductive layer to a predetermined depth, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, forming a sixth insulating film on the surface of the fifth insulating film, removing the section of the sixth insulating film formed on the surface of the fifth insulating film and the section of the sixth insulating film formed on the surface in the center and its vicinity of the bottom surface of the second trench, injecting impurities into the section of the second conductive layer below the fifth insulating film exposed on the bottom surface of the second trench, forming a second conductive type of buried diffusion region by heating and diffusing the impurities, removing the fifth insulating film and the sixth insulating film, and forming a source electrode film on the surface of the fourth insulating film and on the surface of the second trench.

Thus, since impurities are injected into a section below the bottom surface of the second trench after having removing the section formed on the surface of the second trench in the center and its vicinity of the bottom surface of the sixth insulating film, the region into which impurities are injected can be made smaller by the amount of the film thickness of the fifth insulating film and the sixth insulating film formed on the peripheral surface of the second trench.

In addition, in a manufacturing method of a semiconductor device, the present invention comprises: forming a second conductive layer of a second conductive type that is the opposite type from a first conductive type over a range extending from the surface of a first conductive type of drain layer, formed so as to be laminated onto the surface of a first conductive type of first conductive layer, to a predetermined depth, forming a first conductive type of source region over a range extending from the surface of the second conductive layer to a predetermined depth, forming a first insulating film on the surface of the source region, opening a predetermined site in the first insulating film to expose the source region, opening the exposed source region to form a first trench so as to reach to the drain layer, removing the first insulating film, forming a second insulating film on the surface of the source region and on the surface of the first trench, forming a gate electrode film on the inner surface of the second insulating film formed within the first trench, removing the section of the second insulating film formed on the surface of the source region and a portion of the section of the second insulating film formed on the surface of the first trench, forming a third insulating film on the surface of the source region, on the surface of the first trench and on the surface of the exposed sections of the second insulating film and the gate electrode film, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, forming a sixth insulating film on the surface of the fifth insulating film, removing the section of the sixth insulating film formed on the surface of the fourth insulating film and the section of the sixth insulating film formed on the surface of the center and its vicinity of the bottom surface of the second trench, injecting impurities into the section of the second conductive layer below the fourth insulating film exposed on the bottom surface of the second trench, forming a second conductive type of buried diffusion region by heating and diffusing the impurities, removing the fifth insulating film and the sixth insulating film, and forming a source electrode film on the surface of the fourth insulating film and on the surface of the second trench.

Thus, similar to the previously described manufacturing methods of a semiconductor device, since impurities are injected below the bottom surface of a second trench after removing the section formed on the surface of the second trench in the center and its vicinity of the bottom surface of a sixth insulating film, the region into which impurities are injected can be made smaller by the amount of the film thickness of the fifth and sixth insulating films formed on the peripheral surface of the second trench.

In addition, in a manufacturing method of a semiconductor device, the present invention comprises: forming a second conductive layer of a second conductive type that is the opposite type from a first conductive type over a range extending from the surface of a first conductive type of drain layer of a semiconductor substrate to a predetermined depth, said semiconductor substrate comprising said drain layer formed so as to be laminated onto the surface of a first conductive type of first conductive layer, forming a first insulating film on the surface of the second conductive layer, opening a predetermined site in the first insulating film to expose the second conductive layer, opening the exposed second conductive layer to form a first trench so as to reach to the drain layer, removing the first insulating film, forming a second insulating film on the surface of the second conductive layer and on the surface of the first trench, forming a gate electrode film on the inner surface of the second insulating film formed within the first trench, removing the section of the second insulating film formed on the surface of the second conductive layer and a portion of the section of the second insulating film formed on the surface of the first trench, forming a third insulating film on the surface of the second conductive layer, on the surface of the first trench and on the surface of the exposed sections of the second insulating film and the gate electrode film, forming a first conductive type of source region over a range extending from the surface of the second conductive layer to a predetermined depth, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, forming a sixth insulating film on the surface of the fifth insulating film, removing the section of the sixth insulating film formed on the surface of the fourth insulating film and the section of the sixth insulating film formed on the surface of the center and its vicinity of the bottom surface of the second trench, injecting impurities into the section of the second conductive layer below the fourth insulating film exposed on the bottom surface of the second trench, forming a second conductive type of buried diffusion region by heating and diffusing the impurities, removing the fifth insulating film and the sixth insulating film, and forming a source electrode film on the surface of the fourth insulating film and on the surface of the second trench.

Thus, similar to the previously described manufacturing methods of a semiconductor device, since impurities are injected into the section below the bottom surface of a second trench after removing the section formed on the surface of the second trench in the center and in the vicinity of the bottom surface of the sixth insulating film, the region into which impurities are injected can be made smaller by the amount of the film thickness of the fifth insulating film and the sixth insulating film formed on the peripheral surface of the second trench.

In addition, in a manufacturing method of a semiconductor device, the present invention comprises: forming a first insulating film on the surface of a first conductive type of drain layer formed so as to be laminated onto the surface of a first conductive type of first conductive layer, opening a predetermined site in the first insulating film to expose the drain layer, opening the drain layer to form a first trench, removing the first insulating film, forming a second insulating film on the surface of the drain layer and on the surface of the first trench, forming a gate electrode film on the inner surface of the second insulating film formed within the first trench, removing the section of the second insulating film formed on the drain layer and a portion of the section of the second insulating film formed on the surface of the first trench, forming a third insulating film on the surface of the drain layer, on the surface of the first trench and on the surface of the exposed sections of the second insulating film and the gate electrode film, forming a second conductive layer of a second conductive type that is the opposite type from the first conductive type over a range extending from the surface of the drain layer to a predetermined depth, forming a first conductive type of source region over a range extending from the surface of the second conductive layer to a predetermined depth, forming a fourth insulating film on the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, injecting impurities into the section of the second conductive layer below the bottom surface of the second trench, forming a second conductive type of buried diffusion region by heating and diffusing the impurities, removing the fifth insulating film, removing the sections of the third insulating film and the fourth insulating film other than sections formed within the first trench deeper than a predetermined depth from the surface of the source region, and forming a source electrode film on the surface of the source region, on the surface of the first trench, and on the surface of the exposed sections of the third insulating film and the fourth insulating film.

Thus, since impurities are injected into the section below the bottom surface of a second trench after forming a fifth insulating film on the peripheral surface of a second trench, the region into which impurities are injected can be made smaller by the amount of the film thickness of the fifth insulating film formed on the peripheral surface of the second trench. In addition, since the section of the fourth insulating film other than the section formed within the first trench is removed, the size of the semiconductor device can be reduced.

In addition, in a manufacturing method of a semiconductor device, the present invention comprises: forming a second conductive layer of a second conductive type that is the opposite type from a first conductive type over a range extending from the surface of a first conductive type of drain layer, formed so as to be laminated on the surface of a first conductive type of first conductive layer, to a predetermined depth, forming a first conductive type of source region over a range extending from the surface of the second conductive layer to a predetermined depth, forming a first insulating film on the surface of the source region, opening a predetermined site in the first insulating film to expose the source region, opening the exposed source region to form a first trench so as to reach to the drain layer, removing the first insulating film, forming a second insulating film on the surface of the source region and on the surface of the first trench, forming a gate electrode film on the inner surface of the second insulating film formed within the first trench, removing the section of the second insulating film formed on the surface of the source region and a portion of the section of the second insulating film formed on the surface of the first trench, forming a third insulating film on the surface of the source region, on the surface of the first trench and on the surface of the exposed sections of the second insulating film and the gate electrode film, forming a fourth insulating film on the surface of the third insulating film, opening predetermined sites in the third insulating film and the fourth insulating film to expose the source region, opening the exposed source region to form a second trench so as to reach to the second conductive layer, forming a fifth insulating film on the surface of the fourth insulating film and on the surface of the second trench, injecting impurities into the section of the second conductive layer below the bottom surface of the second trench, forming a second conductive type of buried diffusion region by heating and diffusing the impurities, removing the fifth insulating film, removing the sections of the third insulating film and the fourth insulating film other than sections formed within the first trench deeper than a predetermined depth from the surface of the source region, and forming a source electrode film on the surface of the source region, on the surface of the first trench and on the surface of the exposed sections of the third insulating film and the fourth insulating film.

Thus, similar to the previously mentioned manufacturing method of a semiconductor device, since impurities are injected into the section below the bottom surface of a second trench after forming a fifth insulating film, the region into which impurities are injected can be made smaller by the amount of the film thickness of the fifth insulating film formed on the peripheral surface of the second trench. In addition, since the section of the fourth insulating film other than the section formed within the first trench is removed, the size of the semiconductor device can be reduced.

In addition, in a manufacturing method of a semiconductor device, the present invention comprises: forming a second conductive layer of a second conductive type that is the opposite type from a first conductive type over a range extending from the surface of a first conductive type of drain layer, formed so as to be laminated onto the surface of a first conductive type of first conductive layer, to a predetermined depth, forming a first insulating film on the surface of the second conductive layer, opening a predetermined site in the first insulating film to expose the second conductive layer, opening the exposed second conductive layer to form a first trench so as to reach to the drain layer, removing the first insulating film, forming a second insulating film on the surface of the second conductive layer and on the surface of the first trench, forming a gate electrode film on the inner surface of the second insulating layer formed within the first trench, removing the section of the second insulating film formed on the surface of the second conductive layer and a portion of the section of the second insulating film formed on the surface of the first trench, forming a third insulating film on the surface of the second conductive layer, on the surface of the first trench, and on the surface of the exposed sections of the second insulating film and the gate electrode film, forming a first conductive type of source region over a range extending from the surface of the second conductive layer to a predetermined depth, forming a fourth insulating film on the surface of the third insulating film, opening predetermined sites in the third insulating film and the fourth insulating film to expose the source region, opening the exposed source region to form a second trench in the source region, forming a fifth insulating film on the surface of the fourth insulating film and on the surface of the second trench, injecting impurities into the section of the second conductive layer below the bottom surface of the second trench, forming a second conductive type of buried diffusion region by heating and diffusing the impurities, removing the fifth insulating film, removing the sections of the third insulating film and the fourth insulating film other than the sections formed within the first trench, and forming a source electrode film on the third insulating film, the fourth insulating film and on the surface of the exposed source region and the surface of the second trench.

Thus, similar to the previously described manufacturing methods of a semiconductor device, since impurities are injected into the section below the bottom surface of a second trench after forming a fifth insulating film on the peripheral surface of a second trench, the region into which impurities are injected can be made smaller by the amount of the film thickness of the fifth insulating film and the sixth insulating film formed on the peripheral surface of the second trench. In addition, since the section of the fourth insulating film other than the section formed within the first trench is removed, the size of the semiconductor device can be reduced.

In addition, in a manufacturing method of a semiconductor device, the present invention comprises: forming a first insulating film on the surface of a first conductive type of drain layer formed so as to be laminated onto the surface of a first conductive type of first conductive layer, opening a predetermined site in the first insulating film to expose the drain layer, opening the drain layer to form a first trench, removing the first insulating film, forming a second insulating film on the surface of the drain layer and on the surface of the first trench, forming a gate electrode film on the inner surface of the second insulating film formed within the first trench, removing the section of the second insulating film formed on the surface of the drain layer and a portion of the section of the second insulating film formed on the surface of the first trench, forming a third insulating film on the surface of the drain layer, on the surface of the first trench and on the surface of the exposed sections of the second insulating film and the gate electrode film, forming a second conductive layer of a second conductive type that is the opposite type from the first conductive type over a range extending from the surface of the drain layer to a predetermined depth, forming a first conductive type of source region over a range extending from the surface of the second conductive layer to a predetermined depth, forming a fourth insulating film on the surface of the third insulating film, removing the sections of the third insulating film and the fourth insulating film other than the sections formed within the first trench deeper than a predetermined depth from the surface of the source region, forming a fifth insulating film on the surface of the source region, on the surface of the first trench and on the surface of the exposed sections of the third insulating film and the fourth insulating film, opening a predetermined site in the fifth insulating film to expose the source region, opening the exposed source region to form a second trench so as to reach to the second conductive layer, forming a sixth insulating film on the surface of the fifth insulating film and on the surface of the second trench, removing the section of the sixth insulating film formed on the surface of the fifth insulating film and the section of the sixth insulating film formed on the surface of the center and its vicinity of the bottom surface of the second trench, injecting impurities into the section of the second conductive layer below the fifth insulating film exposed on the bottom surface of the second trench, forming a second conductive type of buried diffusion region by heating and diffusing the impurities, removing the fifth insulating film and the sixth insulating film, removing the sections of the third insulating film and the fourth insulating film other than the sections formed within the first trench deeper than a predetermined depth from the surface of the source region, and forming a source electrode film on the surface of the source region, on the surface of the first trench and on the surface of the exposed sections of the third insulating film and the fourth insulating film.

Thus, since impurities are injected into the section below the bottom surface of a second trench after removing the portion formed in the center and its vicinity of the bottom surface of a sixth insulating film, the region into which impurities are injected can be made smaller by the amount of the film thickness of the fifth insulating film and the sixth insulating film formed on the peripheral surface of the second trench. In addition, since the section of the fourth insulating film other than the section formed within the first trench is removed, the size of the semiconductor device can be reduced.

In addition, in a manufacturing method of a semiconductor device, the present invention comprises: forming a second conductive layer of a second conductive type that is the opposite type from a first conductive type over a range extending from the surface of a first conductive type of drain layer of a semiconductor substrate to a predetermined depth, said semiconductor substrate comprising said drain layer formed over a range from one of the main sides to a predetermined depth, forming a first conductive type of source region over a range extending from the surface of the second conductive layer to a predetermined depth, forming a first insulating film on the surface of the source region, opening a predetermined site in the first insulating film to expose the source region, opening the exposed source region to form a first trench so as to reach to the drain layer, removing the first insulating film, forming a second insulating film on the surface of the source region and on the surface of the first trench, forming a gate electrode film on the inner surface of the second insulating film formed within the first trench, removing the section of the second insulating film formed on the surface of the source region and a portion of the section of the second insulating film formed on the surface of the first trench, forming a third insulating film on the surface of the source region, on the surface of the first trench and on the surface of the exposed sections of the second insulating film and the gate electrode film, forming a fourth insulating film on the surface of the third insulating film, removing the sections of the third insulating film and the fourth insulating film other than the sections formed within the first trench deeper than a predetermined depth from the surface of the source region, forming a fifth insulating film on the surface of the source region, on the surface of the first trench and on the surface of the exposed sections of the third insulating film and the fourth insulating film, opening a predetermined site in the fifth insulating film to expose the source region, opening the exposed source region to form a second trench so as to reach to the second conductive layer, forming a sixth insulating film on the surface of the fifth insulating film and on the surface of the second trench, removing the section of the sixth insulating film formed on the surface of the fifth insulating film and the section of the sixth insulating film formed on the surface of the center and its vicinity of the bottom surface of the second trench, injecting impurities into the section of the second conductive layer below the fifth insulating film exposed on the bottom surface of the second trench, forming a second conductive type of buried diffusion region by heating and diffusing the impurities, removing the fifth insulating film and the sixth insulating film, removing the sections of the third insulating film and the fourth insulating film other than the sections formed within the first trench deeper than a predetermined depth from the surface of the source region, and forming a source electrode film on the surface of the source region, on the surface of the first trench and on the surface of the exposed sections of the third insulating film and the fourth insulating film.

Thus, since impurities are injected into a section below the bottom surface of a second trench after removing the section formed in the center and its vicinity of the bottom surface of a sixth insulating film, the region into which impurities are injected can be made smaller by the amount of the film thickness of the fifth insulating film and the sixth insulating film formed on the peripheral surface of the second trench. In addition, since the section of the fourth insulating film other than the section formed within the first trench is removed, the size of the semiconductor device can be reduced.

In addition, in a manufacturing method of a semiconductor device, the present invention comprises: forming a second conductive layer of a second conductive type that is the opposite type from a first conductive type over a range extending from the surface of a first conductive type of drain layer, formed so as to be laminated onto the surface of a first conductive type of first conductive layer, to a predetermined depth, forming a first insulating film on the surface of the second conductive layer, opening a predetermined site in the first insulating film to expose the second conductive layer, opening the exposed second conductive layer to form a first trench so as to reach to the drain layer, removing the first insulating film, forming a second insulating film on the surface of the second conductive layer and on the surface of the first trench, forming a gate electrode film on the inner surface of the second insulating film formed within the first trench, removing the section of the second insulating film formed on the surface of the second conductive layer and a portion of the section of the second insulating film formed on the surface of the first trench, forming a first conductive type of source region over a range extending from the surface of the second conductive layer to a predetermined depth, forming a third insulating film on the surface of the source region, on the surface of the first trench and on the surface of the exposed section of the gate electrode film, forming a fourth insulating film on the surface of the third insulating film, removing the sections of the third insulating film and the fourth insulating film other than the sections formed within the first trench deeper than a predetermined depth from the surface of the source region, forming a fifth insulating film on the surface of the source region, on the surface of the first trench and on the surface of the exposed sections of the third insulating film and the fourth insulating film, opening a predetermined site in the fifth insulating film to expose the source region, opening the exposed source region to form a second trench so as to reach to the second conductive layer, forming a sixth insulating film on the surface of the fifth insulating film and on the surface of the second trench, removing the section of the sixth insulating film formed on the surface of the fifth insulating film and the section of the sixth insulating film formed on the surface of the center and its vicinity of the bottom surface of the second trench, injecting impurities into the section of the second conductive layer below the fifth insulating film exposed on the bottom surface of the second trench, forming a second conductive type of buried diffusion region by heating and diffusing the impurities, removing the fifth insulating film and the sixth insulating film, removing the sections of the third insulating film and the fourth insulating film other than the sections formed within the first trench deeper than a predetermined depth from the surface of the source region, and forming a source electrode film on the surface of the source region, on the surface of the first trench and on the surface of the exposed sections of the third insulating film and the fourth insulating film.

Thus, since impurities are injected into a section below the bottom surface of a second trench after removing the section on the surface of a second trench formed in the center and in its vicinity of the bottom surface of a sixth insulating film, the region into which impurities are injected can be made smaller by the amount of the film thickness of the fifth insulating film and the sixth insulating film formed on the peripheral surface of the second trench. In addition, since the section of the fourth insulating film other than the section formed within the first trench is removed, the size of the semiconductor device can be reduced.

BEST MODE FOR CARRYING OUT THE INVENTION

Figure 1:
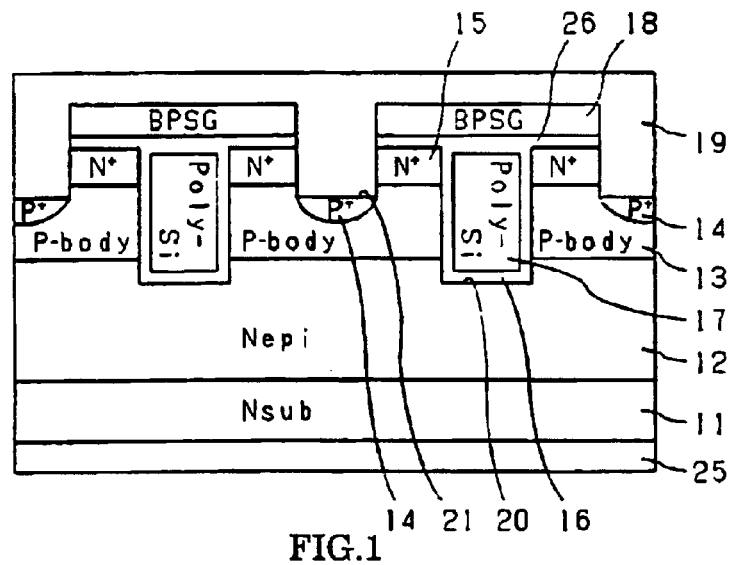
FIG. 1 is an explanatory view showing a semiconductor device according to a first embodiment of the present invention.
Figure 2A:
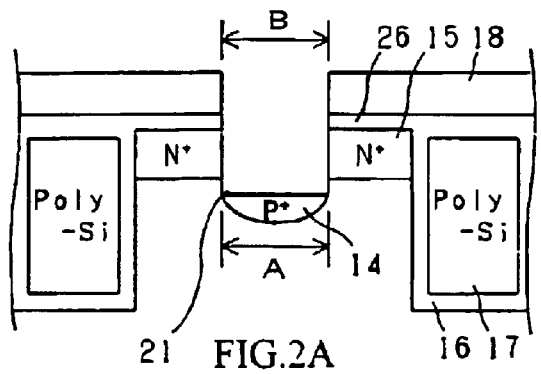
FIGS. 2A and 2B are explanatory views showing a comparison of the constitutions of a source trench and its vicinity in a semiconductor device according to a first embodiment of the present invention and the corresponding sections in a semiconductor device according to the prior art, with FIG. 2A showing a source trench and its vicinity in a semiconductor device according to a first embodiment of the present invention, and FIG. 2B showing a comparison with the corresponding sections in a semiconductor device according to the prior art.
Figure 2B:
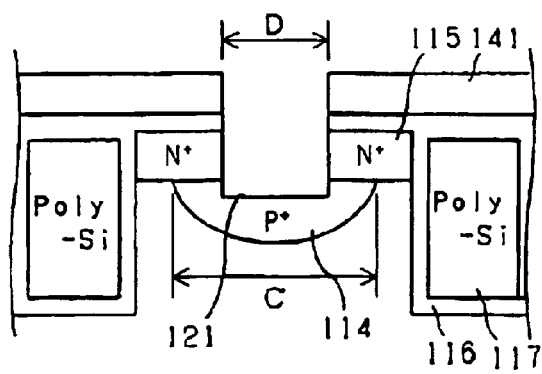

The following provides a detailed explanation of a semiconductor device according to a first embodiment of the present invention based on the drawings. FIG. 1 is an explanatory view showing a semiconductor device according to a first embodiment of the present invention. In addition, FIGS. 2A and 2B are explanatory views showing a source trench and its vicinity in a semiconductor device according to a first embodiment of the present invention along with the constitution of said section of a semiconductor device according to the prior art for comparison, with FIG. 2A showing a source trench and its vicinity in a semiconductor device according to a first embodiment of the present invention, and FIG. 2B showing the constitution of said section of a semiconductor device according to the prior art for comparison. In the figures, reference symbol 11 indicates an N$^+$-type silicon substrate, 12 an N$^-$-type epitaxial layer, 13 a P-type body layer, 14 a buried P$^+$-type diffusion region, 15 an N$^+$-type source region, 16 a gate insulating film, 17 a gate electrode film, 18 a borophosphosilicate glass (BPSG) film, 19 a source electrode film, 20 a gate trench, 21 a source trench, 25 a drain electrode film, and 26 an insulating film.

The semiconductor device according to a first embodiment of the present invention forms a drain layer in the form of N$^-$-type epitaxial layer 12 on one of the primary sides of N$^+$-type silicon substrate 11. Moreover, P-type body layer 13 is formed on N$^-$-type epitaxial layer 12. In addition, N$^+$-type source region 15 is formed over the range of a fixed depth from the surface of P-type body layer 13.

In addition, P-type body layer 13 is opened at predetermined intervals to alternately form gate trench 20 and source trench 21. Gate trench 20 is formed so that its tip section reaches to a comparatively shallow site of N$^-$-type epitaxial layer 12. In addition, gate insulating film 16 is adhered and formed on the peripheral and bottom surfaces of gate trench 20. Moreover, gate electrode film 17 is formed on the surface of gate insulating film 16. Gate electrode film 17 is comprised by depositing polysilicon, and is formed so as to fill in the space surrounded by gate insulating film 16. In addition, insulating film 26 is formed so as to cover gate insulating film 16, gate electrode film 17 and the surface of N$^+$-type source region 15. Insulating film 26 is a silicon oxide film, and although it is integrally formed with gate insulating film 16, as will be described later, it is formed in a separate step from gate insulating film 16. Moreover, a different insulating film in the form of BPSG film 18 is formed on the surface of insulating film 26. Furthermore, gate trench 20 may be formed to be deeper as necessary, and conversely, and may be formed so that its depth is at about the same location or slightly shallower than the interface between N$^-$-type epitaxial layer 12 and P-type body layer 13.

Source trench 21 is formed so as to reach to a comparatively shallow site of P-type body layer 13. In addition, buried P$^+$-type diffusion region 14 is formed so as to be exposed on the bottom surface of source trench 21. Moreover, as shown in FIG. 2A, the width A of buried P$^+$-type diffusion region 14 is made to be roughly the same as width B of the opening of source trench 21. Furthermore, in FIG. 1, although source trench 21 is formed so as to reach to P-type body layer 13 to enable it to make stable contact with P-type body layer 13, it may also be formed only within N$^+$-type source region 15. In addition, width A of buried P$^+$-type diffusion region 14 can be changed within a range that is narrower than width B of the opening of source trench 21.

The range extending to source trench 21, buried P$^+$-type diffusion region 14 exposed on the bottom surface of source trench 21, N$^+$-type source region 15 adjacent to source trench 21 and their vicinity to the center of gate trench 20 adjacent to N$^+$-type source region 15 constitute a single cell. In addition, as was previously described, since gate trench 20 and source trench 21 are alternately formed, in terms of the entire semiconductor device, the structure is such that a large number of cells are arranged divided by gate trench 20. In addition, the cross-sectional structure of the semiconductor device shown in FIG. 1 is continuous in the direction of depth of said cross-section, and each cell is formed in the form of a stripe. Furthermore, when the semiconductor device is viewed from overhead, these cells may be formed into a rectangular shape, a hexagonal or other polygonal shape or a circular shape by forming gate trench 20 so as to present a lattice shape or staggered shape.

In addition, source electrode film 19 is formed inside source trench 21 and on the surface of BPSG film 18. Moreover, drain electrode film 25 is formed on the other side of N$^+$-type silicon substrate 11. Furthermore, source electrode film 19 and drain electrode film 25 are preferably formed using, for example, Al—Si or Al—Si—Cu.

In this semiconductor device, when a voltage is applied between source electrode film 19 and drain electrode film 25, and a voltage equal to or greater than a predetermined threshold voltage is applied between gate electrode film 17 and source electrode film 19, an inversion layer is formed in the vicinity of the boundary region between P-type body 13 and gate insulating film 16 resulting in a channel. Current then flows through this channel from drain electrode film 25 to source electrode film 19. In addition, if the voltage between gate electrode film 17 and source electrode film 19 is lowered below a predetermined threshold value, this channel is terminated, and current no longer flows between drain electrode film 25 and source electrode film 19.

However, as shown in FIG. 2A, in the semiconductor device according to a first embodiment of the present invention, width A of buried P$^+$-type diffusion region 14 is made to be roughly the same as width B of the opening of source trench 21. In contrast, in a semiconductor device according to the prior art, as shown in FIG. 2B, width C of buried P$^+$-type diffusion region 114 is wider than width D of the opening of source trench 121. Accordingly, due to limitations on the accuracy in the photographic step of trench formation, source trench 121 is not formed at a predetermined site, and even if it is formed near any of gate trenches 20, as shown in the constitution shown in FIG. 2B, buried P$^+$-type diffusion region 14 does not contact gate insulating film 16.

Moreover, an explanation is provided of the manufacturing process of a semiconductor device according to a first embodiment of the present invention. FIGS. 9 through 16 consist of cross-sectional views (a), explaining the manufacturing process of a semiconductor device according to a first embodiment of the present invention through (h) explaining the manufacturing process of a semiconductor device according to a first embodiment of the present invention. In these figures, reference symbol 30 indicates a silicon oxide film, and reference symbol 31 indicates a boron ion injection section. Other reference symbols indicate the same constituents as those shown in FIG. 1.

Figure 9:
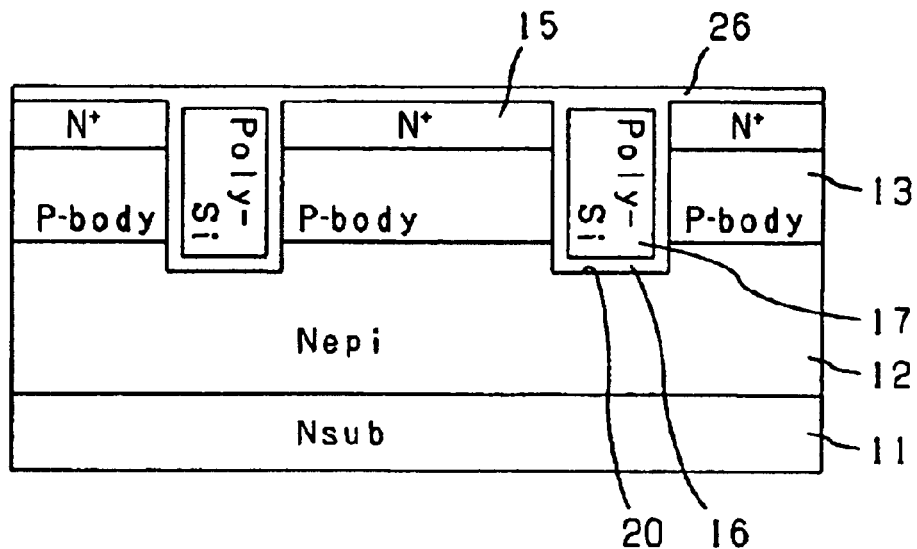
FIG. 9 is a cross-sectional view (a) explaining the manufacturing process of a semiconductor device according to a first embodiment of the present invention.

First, as shown in FIG. 9, a trench-type gate electrode structure is preliminarily formed. A specific example of this process consists of first forming N⁻-type epitaxial layer 12 by epitaxial growth on the surface of N⁺-type silicon substrate 11. Next, a silicon oxide film not shown is formed on N⁻-type epitaxial layer 12. Next, a predetermined site in this silicon oxide film is opened by etching to expose N⁻-type epitaxial layer 12, after which this N⁻-type epitaxial layer 12 is opened by etching to form gate trench 20. Next, after removing the aforementioned silicon oxide film, gate insulating film 16 is formed so as to cover the surface of gate trench 20. Moreover, gate electrode film 17 is deposited and formed on the surface of gate insulating film 16 and on the surface of N⁻-type epitaxial layer 12 followed by removing gate electrode film 17 on the surface of N⁻-type epitaxial layer 12 by etching.

Next, the section above gate electrode film 17, including the section of gate insulating film 16 formed on the surface of N⁻-type epitaxial layer 12, is removed by etching. Insulating film 26 is then formed on the surface of N⁻-type epitaxial layer 12, the surface of gate trench 20 and the exposed section of gate electrode film 17. Next, after diffusing and forming P-type body on N⁻-type epitaxial layer 12 over a range of a predetermined depth, N⁺-type source region 15 is diffused and formed within P-type body layer 13 over a range of a predetermined depth.

Furthermore, in the aforementioned manufacturing process, the formation of P-type body layer 13 and N⁺-type source region 15 may also be carried out prior to forming a silicon oxide film not shown on N⁻-type epitaxial layer 12. In addition, the formation of P-type body layer may be carried out prior to forming the aforementioned silicon oxide film on N⁻-type epitaxial layer 12, and the diffusion and formation of N⁺-type source region 15 may be carried out after forming insulating film 26.

Figure 10:
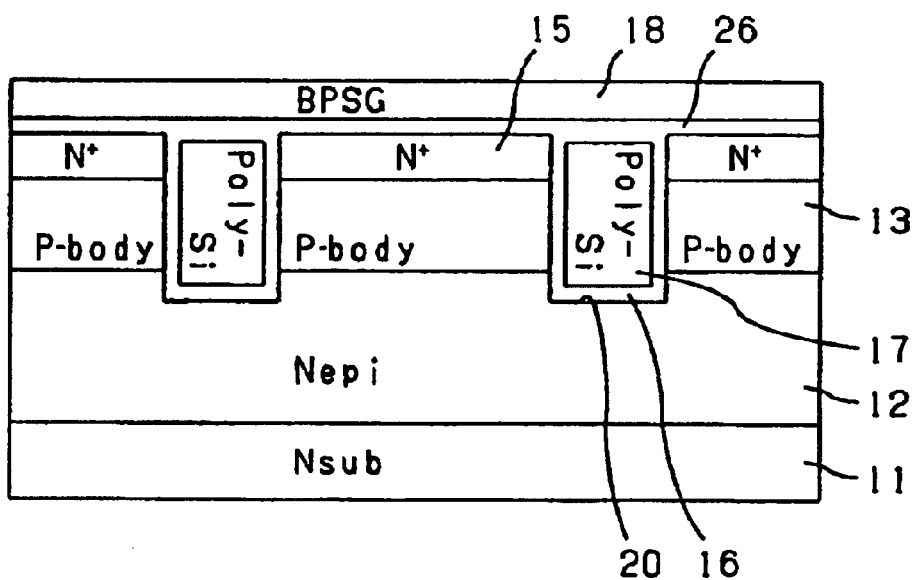
FIG. 10 is a cross-sectional view (b) explaining the manufacturing process of a semiconductor device according to a first embodiment of the present invention.
Figure 11:
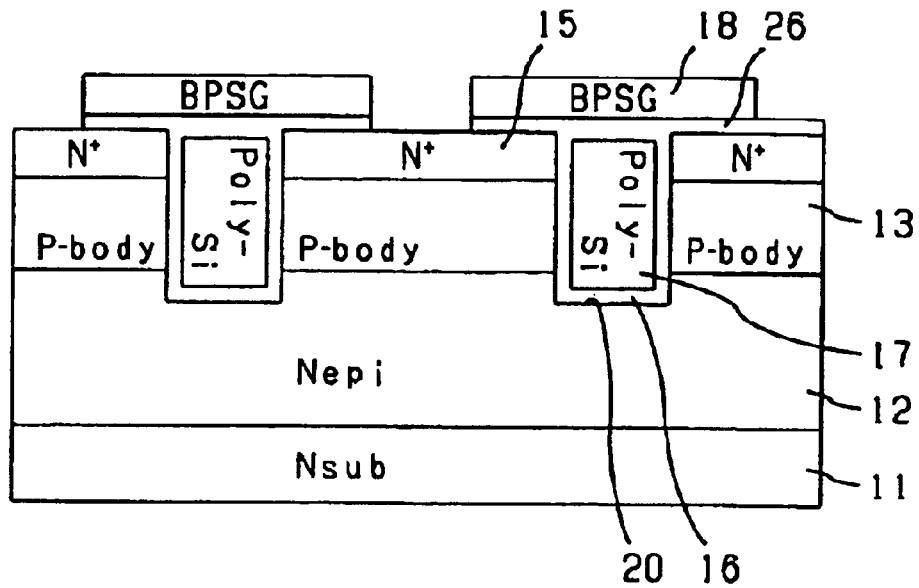
FIG. 11 is a cross-sectional view (c) explaining the manufacturing process of a semiconductor device according to a first embodiment of the present invention.
Figure 12:
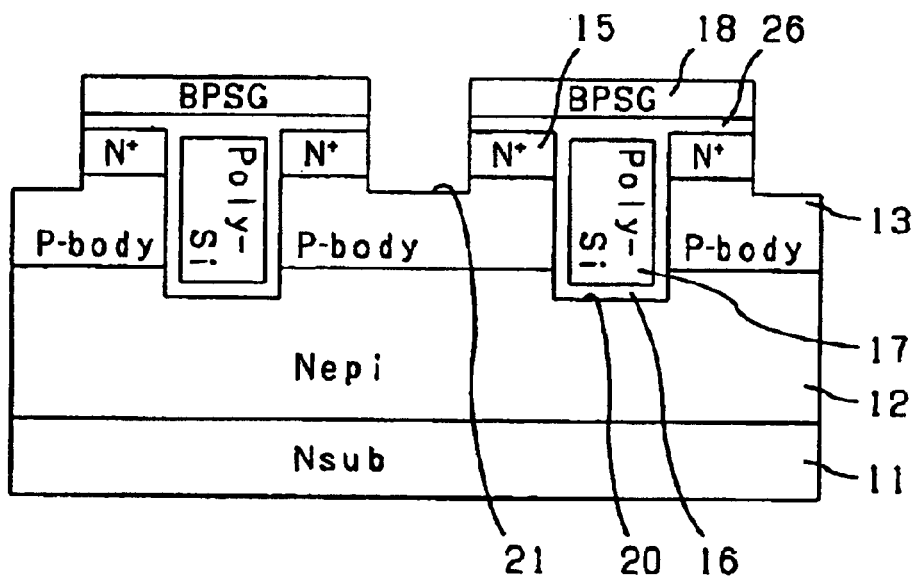
FIG. 12 is a cross-sectional view (d) explaining the manufacturing process of a semiconductor device according to a first embodiment of the present invention.

Next, as shown in FIG. 10, BPSG film 18 is deposited and formed on the surface of insulating film 26 by CVD. As shown in FIG. 11, together with opening a predetermined site in BPSG film 18 by etching, an opening is simultaneously formed at the same site in insulating film 26 by etching. Furthermore, insulating film 26 may also be etched in a different step. As shown in FIG. 12, etching is performed to P-type body layer 13 using BPSG film 18 and insulating film 26 as masks to form source trench 21. Furthermore, the depth of source trench 21 can be made to be shallower or deeper than that shown in FIG. 12 as necessary.

Figure 13:
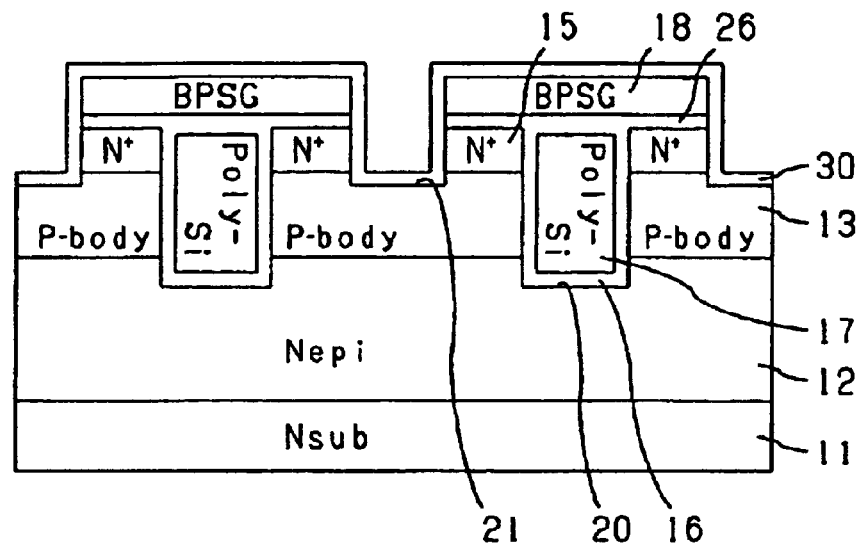
FIG. 13 is a cross-sectional view (e) explaining the manufacturing process of a semiconductor device according to a first embodiment of the present invention.
Figure 14:
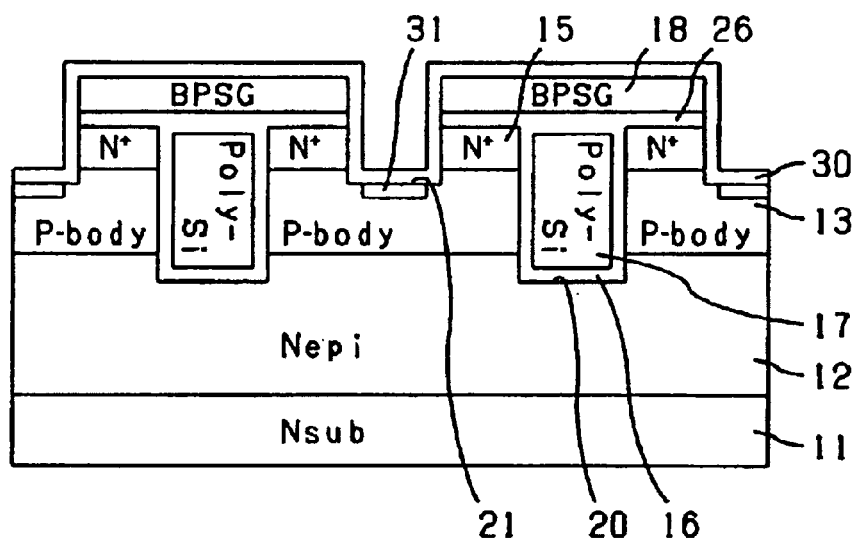
FIG. 14 is a cross-sectional view (f) explaining the manufacturing process of a semiconductor device according to a first embodiment of the present invention.
Figure 15:
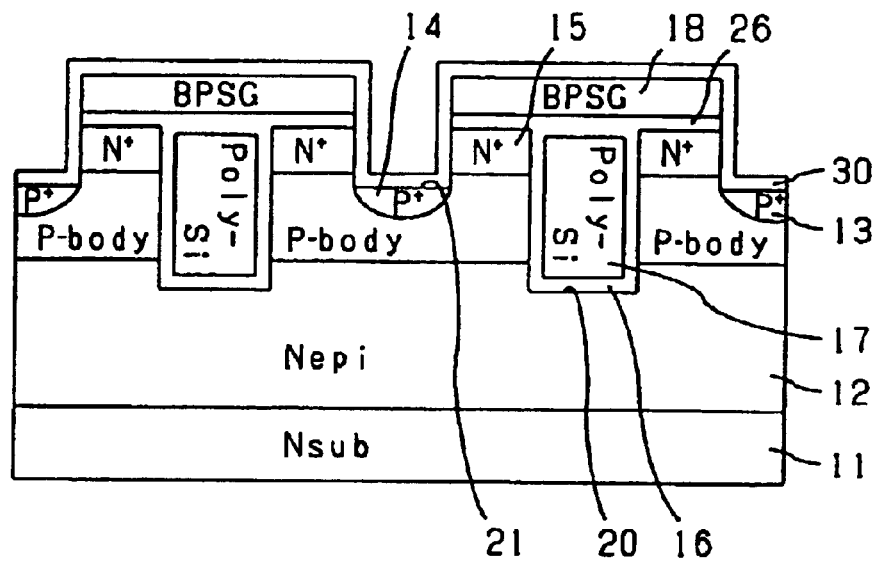
FIG. 15 is a cross-sectional view (g) explaining the manufacturing process of a semiconductor device according to a first embodiment of the present invention.

Next, as shown in FIG. 13, silicon oxide film 30 is deposited and formed on the surfaces of BPSG film 18 and source trench 21 by CVD. As shown in FIG. 14, boron ions (B⁺) are injected into the bottom surface of source trench 21. Next, the boron ions are diffused by heating boron ion injection section 31 to form buried P⁺-type diffusion region 14 as shown in FIG. 15. Furthermore, gallium (Ga), aluminum (Al), indium (In) or BF2 and so forth may be used for the injection ions instead of boron. Source electrode film 19 shown in FIG. 1 is then formed by sputtering on the surface of BPSG film 18 and on the surface of source trench 21. Finally, drain electrode film 25 shown in FIG. 1 is formed by sputtering on the other side of N⁺-type silicon substrate 11.

Figure 16:
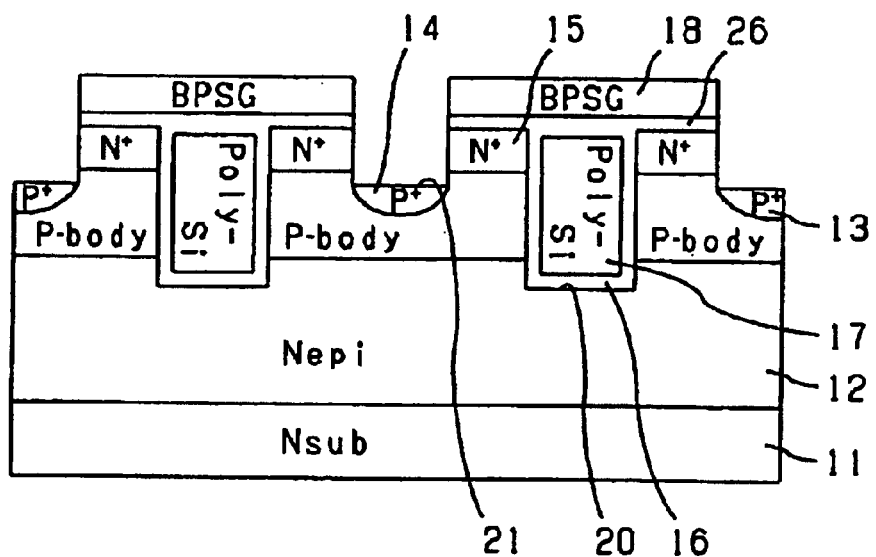
FIG. 16 is a cross-sectional view (h) explaining the manufacturing process of a semiconductor device according to a first embodiment of the present invention.

Furthermore, the steps shown in FIGS. 14 through 16 can be substituted with other steps. FIGS. 17 through 21 are cross-sectional views explaining a different manufacturing process of a semiconductor device according to a first embodiment of the present invention (a) through cross-sectional views explaining a manufacturing process of a semiconductor device according to a first embodiment of the present invention (e). In these figures, reference symbol 32 indicates a silicon nitride film, 33 a side wall, 34 an inclined surface, and 35 a boron ion injection section. Other reference symbols indicate the same constituents as those shown in FIG. 1.

Figure 17:
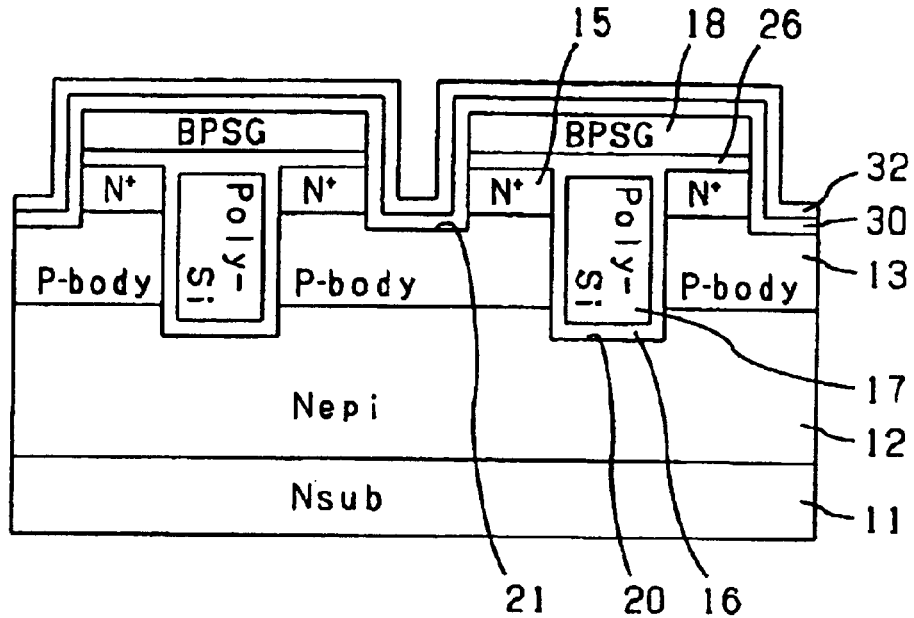
FIG. 17 is a cross-sectional view (a) explaining a different manufacturing process of a semiconductor device according to a first embodiment of the present invention.
Figure 18:
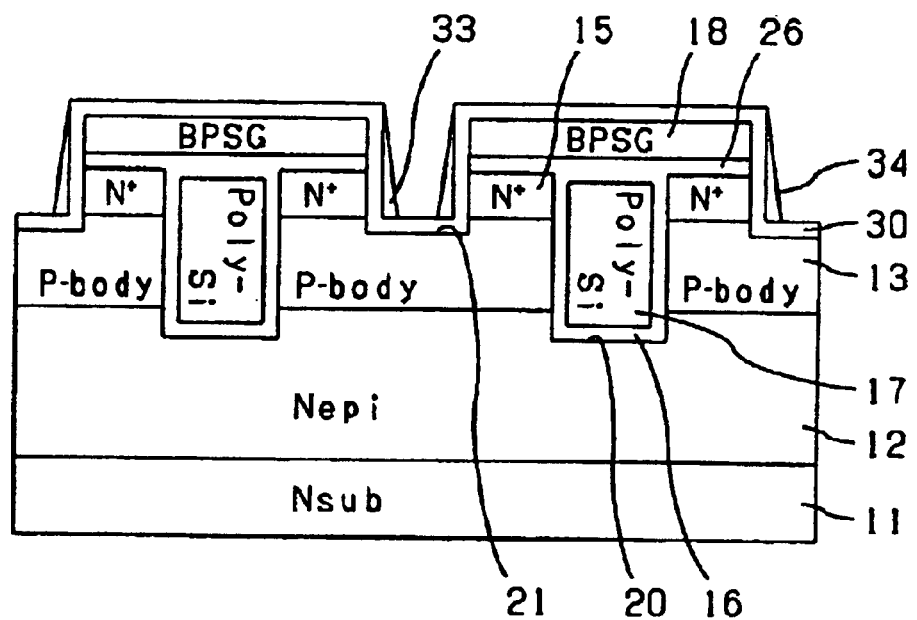
FIG. 18 is a cross-sectional view (b) explaining a different manufacturing process of a semiconductor device according to a first embodiment of the present invention.

Following the step shown in FIG. 13, as shown in FIG. 17, silicon nitride film 32 is deposited and formed on the surface of source trench 21 and on insulating film 26. Next, as shown in FIG. 18, the sections of silicon nitride film 32 formed on insulating film 26 and the bottom surface of source trench 21 are removed by anisotropic etching. As a result, side wall 33 is formed on the peripheral surface of source trench 21. Since the surface of side wall 33 is in the form of inclined surface 34, the thickness of the section on the bottom surface side of source trench 21 remains unchanged. Thus, only the center and its vicinity of source trench 21 are exposed by this thick section serving as a mask.

Figure 19:
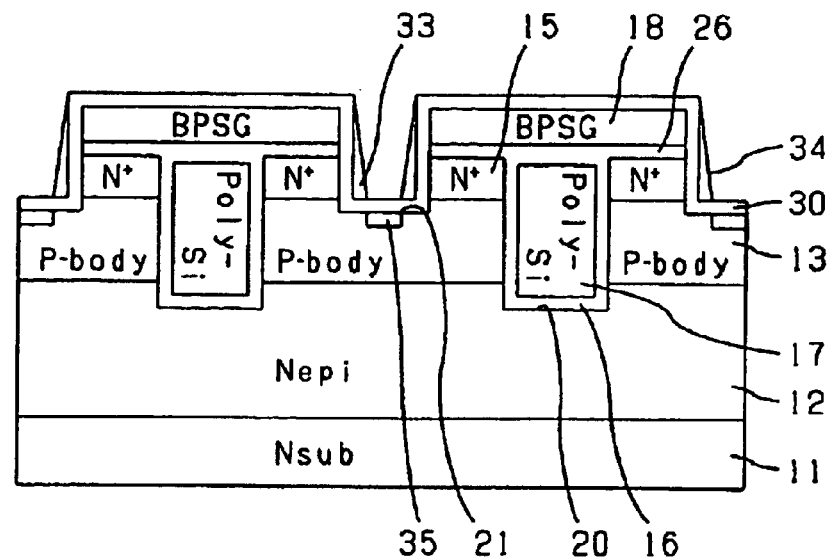
FIG. 19 is a cross-sectional view (c) explaining a different manufacturing process of a semiconductor device according to a first embodiment of the present invention.
Figure 20:
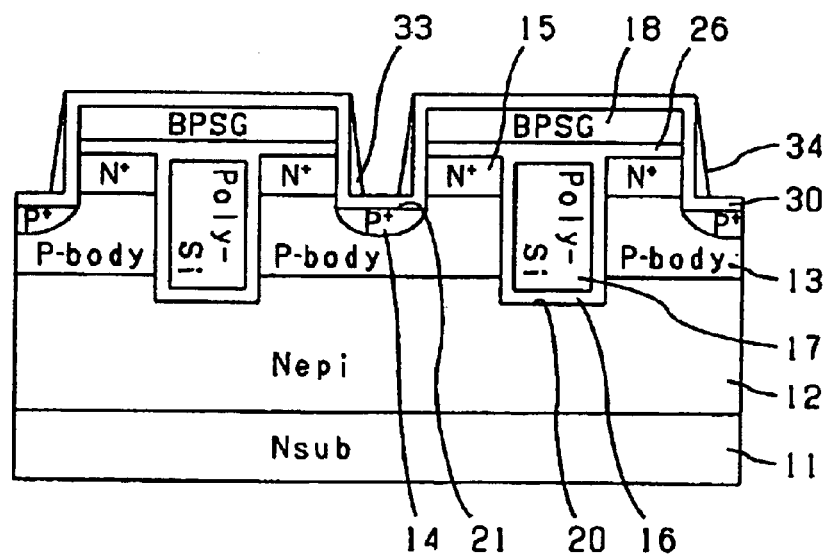
FIG. 20 is a cross-sectional view (d) explaining a different manufacturing process of a semiconductor device according to a first embodiment of the present invention.
Figure 21:
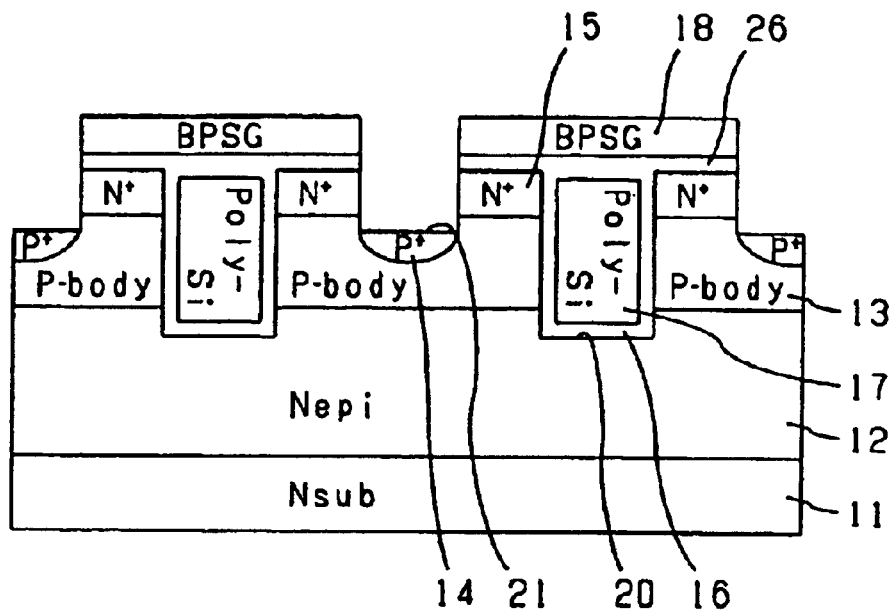
FIG. 21 is a cross-sectional view (e) explaining a different manufacturing process of a semiconductor device according to a first embodiment of the present invention.

Next, as shown in FIG. 19, boron ions (B⁺) are injected onto the bottom surface of source trench 21. The boron ions are then diffused by heating boron ion injection section 35 to form buried P⁺-type diffusion region 14 as shown in FIG. 20. As shown in FIG. 21 side wall 33 and insulating film 26 are then sequentially removed by etching. Finally, source electrode film 19 and drain electrode film 25 as shown in FIG. 1 are formed on the surface of BPSG film 18 and on the surface of source trench 21 by sputtering.

According to the manufacturing process as described above, buried P⁺-type diffusion region 14 can be easily formed to roughly the same width or narrower than the opening of source trench 21. In addition, although the number of steps of the steps shown in FIGS. 17 through 21 is greater than the number of steps shown in FIGS. 14 through 16, the size of buried P⁺-type diffusion region 14 can be made to be smaller than with the steps shown in FIGS. 14 through 16.

Figure 3:
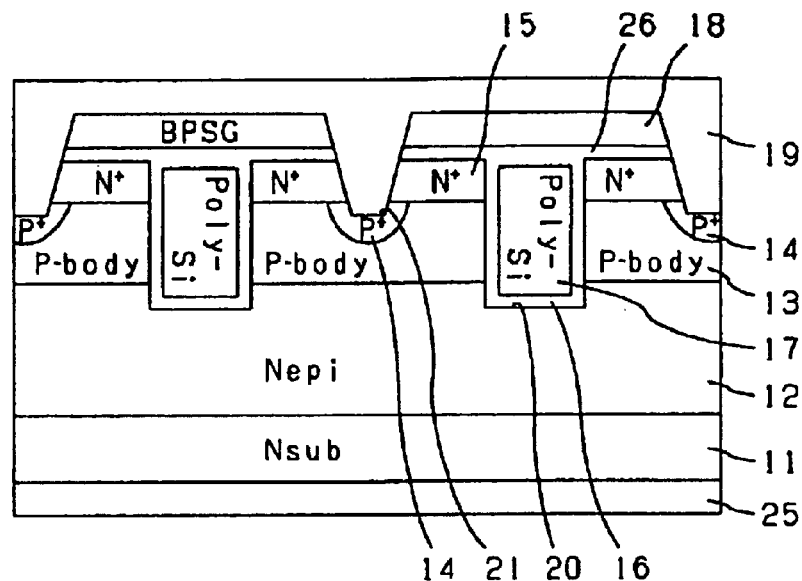
FIG. 3 is a cross-sectional view showing a semiconductor device according to a second embodiment of the present invention.

Next, an explanation is provided of a semiconductor device according to a second embodiment of the present invention based on the drawings. FIG. 3 is a cross-sectional view showing a semiconductor device according to a second embodiment of the present invention. In the figure, reference symbol 22 indicates a source trench. Other reference symbols indicate the same constituents as those shown in FIG. 1.

In this semiconductor device according to a second embodiment of the present invention, source trench 22 is formed by inclining its peripheral surface so that the width of source trench 22 becomes narrower towards the bottom. Accordingly, it is even a more smaller than source trench 21 shown in FIG. 1. Thus, if the process relating to boron ion injection of a semiconductor device according to a first embodiment of the present invention is applied to a semiconductor device according to this second embodiment, the area onto which boron ions are injected can be made to be even smaller, and buried P⁺-type diffusion region 14 can be made to be smaller than that shown in FIG. 1. Furthermore, constituents other than source trench 22 are the same as those shown in FIG. 1.

Figure 4:
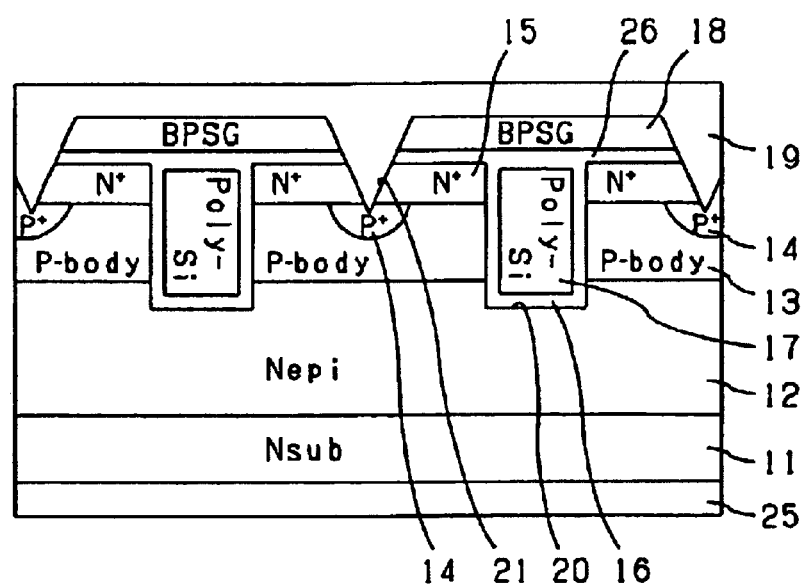
FIG. 4 is a cross-sectional view showing a semiconductor device according to a third embodiment of the present invention.

Moreover, an explanation is provided of a semiconductor device according to a third embodiment of the present invention based on the drawings. FIG. 4 is a cross-sectional view showing a semiconductor device according to a third embodiment of the present invention. In the figure, reference symbol 23 indicates a source trench. Other reference symbols indicate the same constituents as those shown in FIG. 1.

In a semiconductor device according to a third embodiment of the present invention, the peripheral surface of source trench 23 is inclined, and the cross-section of source trench 23 is formed roughly into the shape of the letter "V". Accordingly, if boron ions are injected as in the aforementioned process in the vicinity of the tip of this pointed source trench 23, the size of buried $P^+$-type diffusion region 14 can be further reduced as compared with that shown in FIG. 1. Furthermore, constituents other than source trench 23 are the same as those shown in FIG. 1.

Figure 5:
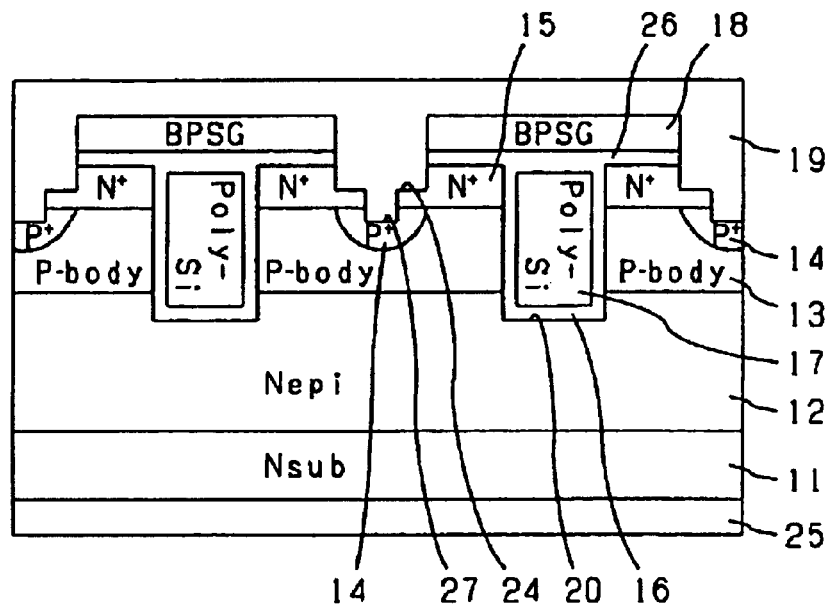
FIG. 5 is a cross-sectional view showing a semiconductor device according to a fourth embodiment of the present invention.

Continuing, an explanation is provided of a semiconductor device according to a fourth embodiment of the present invention based on the drawings. FIG. 5 is a cross-sectional view showing a semiconductor device according to a fourth embodiment of the present invention. In the figure, reference symbol 24 indicates a source trench, and 27 an indentation. Other reference symbols indicate the same constituents as those shown in FIG. 1.

In a semiconductor device according to a fourth embodiment of the present invention, indentation 27 is formed in the bottom surface of source trench 24. Accordingly, if boron ions are injected only onto this indentation 27, the size of buried $P^+$-type diffusion region 14 can be further reduced as compared with that shown in FIG. 1. Furthermore, constituents other than source trench 24 are the same as those shown in FIG. 1.

Figure 6:
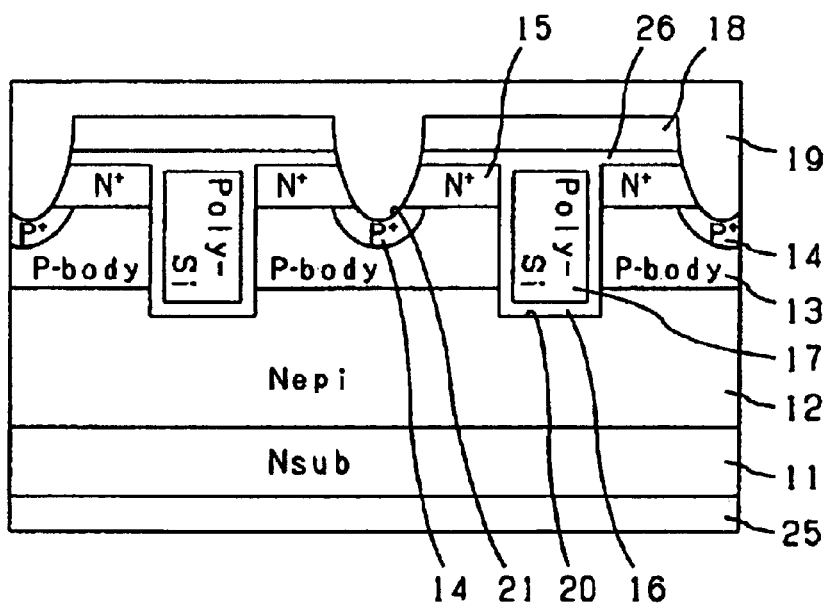
FIG. 6 is a cross-sectional view showing a semiconductor device according to a fifth embodiment of the present invention.

Continuing, an explanation is provided of a semiconductor device according to a fifth embodiment of the present invention based on the drawings. FIG. 6 is a cross-sectional view showing a semiconductor device according to a fifth embodiment of the present invention. The reference symbols shown in FIG. 6 indicate the same constituents as the reference symbols shown in FIG. 1.

In a semiconductor device according to a fifth embodiment of the present invention, the inner surface of source trench 21 is formed to be a curved surface in which the bottom surface and side surface are integrated. Thus, if boron ions are only injected onto the tip of source trench 21, buried $P^+$-type diffusion region 14 can be formed similar to that shown in FIG. 1. Furthermore, constituents other than source trench 24 are the same as those shown in FIG. 1. In addition, in the semiconductor device according to this embodiment, the inner surface of source trench 22 can also be formed roughly into the shape of the letter "U" by combining a flat surface and a curved surface.

Figure 7:
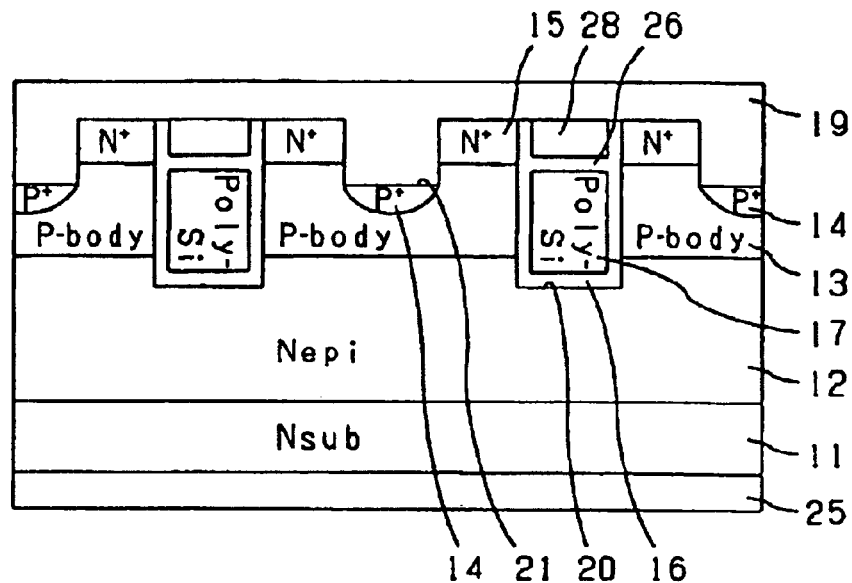
FIG. 7 is a cross-sectional view showing a semiconductor device according to a sixth embodiment of the present invention.

Moreover, an explanation is provided of a semiconductor device according to a sixth embodiment of the present invention based on the drawings. FIG. 7 is a cross-sectional view showing a semiconductor device according to a sixth embodiment of the present invention. In the figure, reference symbol 28 indicates a BPSG film. Other reference symbols indicate the same constituents as those shown in FIG. 1.

In a semiconductor device according to a sixth embodiment of the present invention, as shown in FIG. 7, insulating film 26 and BPSG film 28 are only formed inside gate trench 20, and their upper surfaces are made to be roughly the same height as the surface of $N^+$-type source region 15. Accordingly, the contact area between $N^+$-type source region 15 and source electrode film 19 can be enlarged. Furthermore, constituents other than the inside of gate trench 20 and its periphery are the same as those shown in FIG. 1.

Moreover, an explanation is provided of the manufacturing process of a semiconductor device according to a sixth embodiment of the present invention. FIGS. 22 through 29 are cross-sectional views explaining the manufacturing process of a semiconductor device according to a sixth embodiment of the present invention (a) through cross-sectional views explaining the manufacturing process of a semiconductor device according to a sixth embodiment of the present invention (h). In these figures, reference symbol 36 indicates a silicon nitride film, and 37 a boron ion injection section. Other reference symbols indicate the same constituents as those shown in FIG. 1 and FIGS. 8 through 15.

Figure 8:
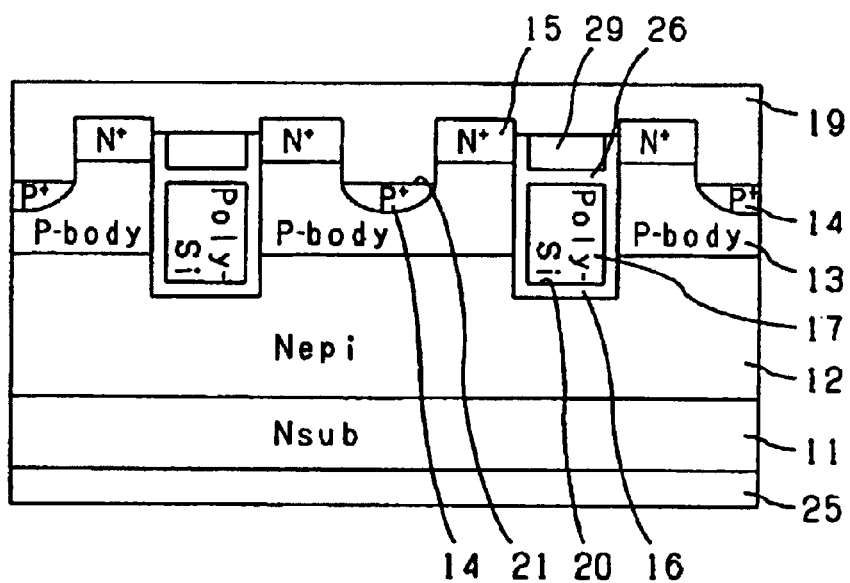
FIG. 8 is a cross-sectional view showing a semiconductor device according to a seventh embodiment of the present invention.
Figure 22:
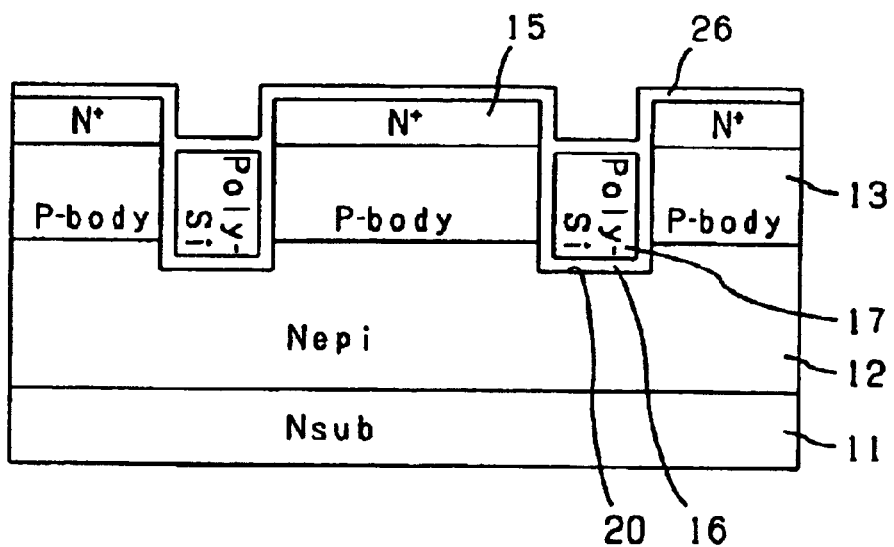
FIG. 22 is a cross-sectional view (a) explaining a manufacturing process of a semiconductor device according to a fifth embodiment of the present invention.
Figure 23:
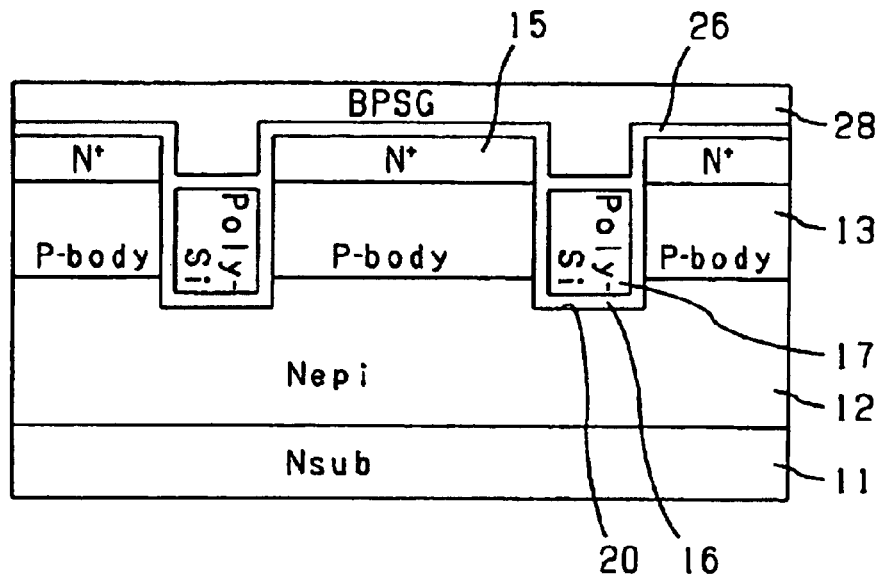
FIG. 23 is a cross-sectional view (b) explaining a manufacturing process of a semiconductor device according to a fifth embodiment of the present invention.
Figure 24:
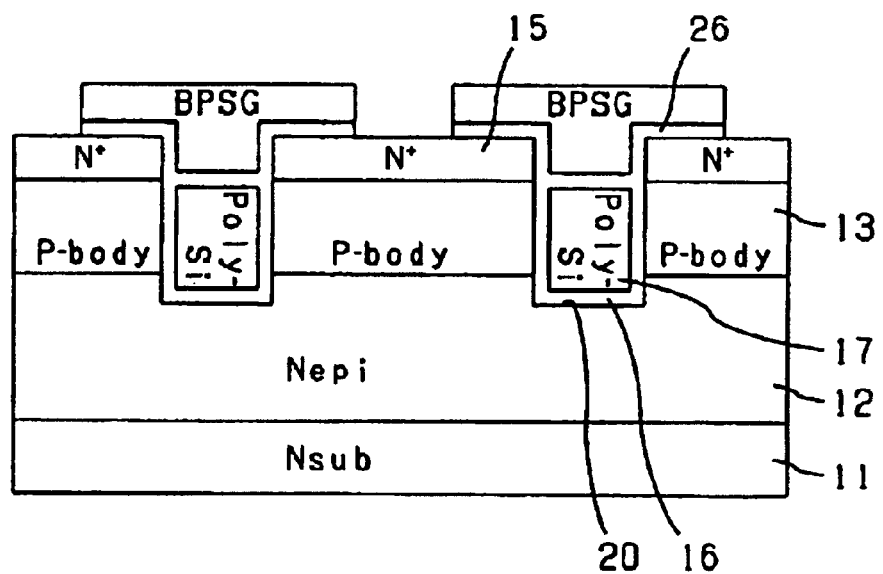
FIG. 24 is a cross-sectional view (c) explaining a manufacturing process of a semiconductor device according to a fifth embodiment of the present invention.

FIG. 22 is a view equivalent to FIG. 8 in the manufacturing process of a semiconductor device according to a first embodiment. In the semiconductor device according to a fifth embodiment, gate electrode film 17 is formed so as sink into gate trench 20. In this state, BPSG is deposited on the surface of insulating film 26 by CVD to form BPSG film 28 as shown in FIG. 23. Next, as shown in FIG. 24, together with opening a predetermined site in BPSG film 28 by etching, an opening is simultaneously formed at the same site in insulating film 26 by etching. Furthermore, insulating film 26 may also be etched in a separate step.

Figure 25:
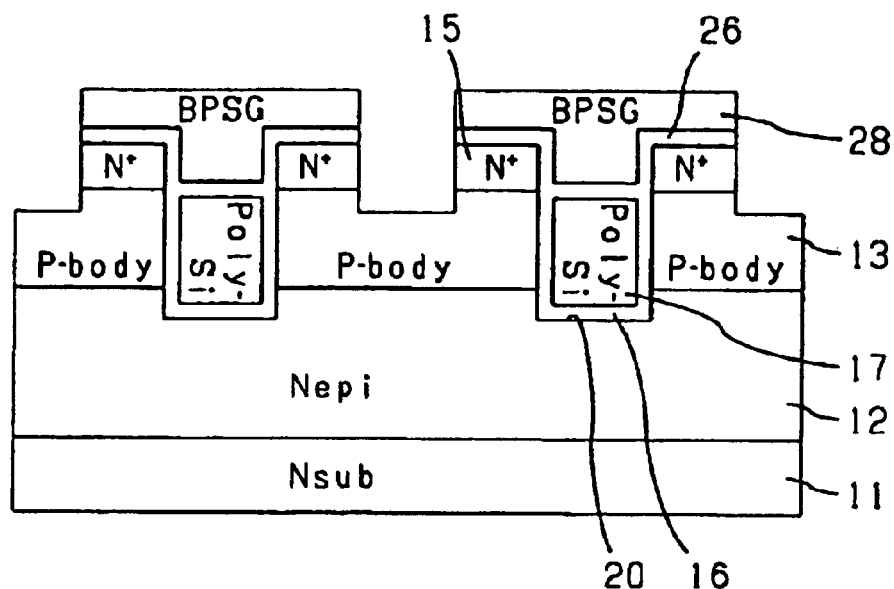
FIG. 25 is a cross-sectional view (d) explaining a manufacturing process of a semiconductor device according to a fifth embodiment of the present invention.
Figure 26:
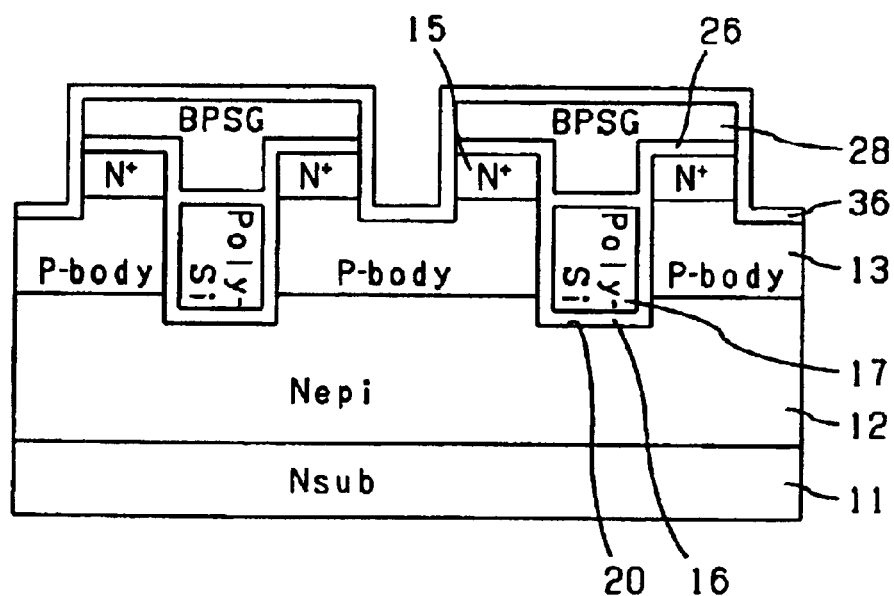
FIG. 26 is a cross-sectional view (e) explaining a manufacturing process of a semiconductor device according to a fifth embodiment of the present invention.

As shown in FIG. 25, etching is performed until P-type body layer 13 is reached by using BPSG film 28 and insulating film 26 as masks to form source trench 21. Furthermore, the depth of source trench 21 can be made to shallower or deeper than that shown in FIG. 25 as necessary. Next, as shown in FIG. 26, silicon oxide film 36 is deposited and formed on the surface of BPSG film 28 and source trench 21 by CVD.

Figure 27:
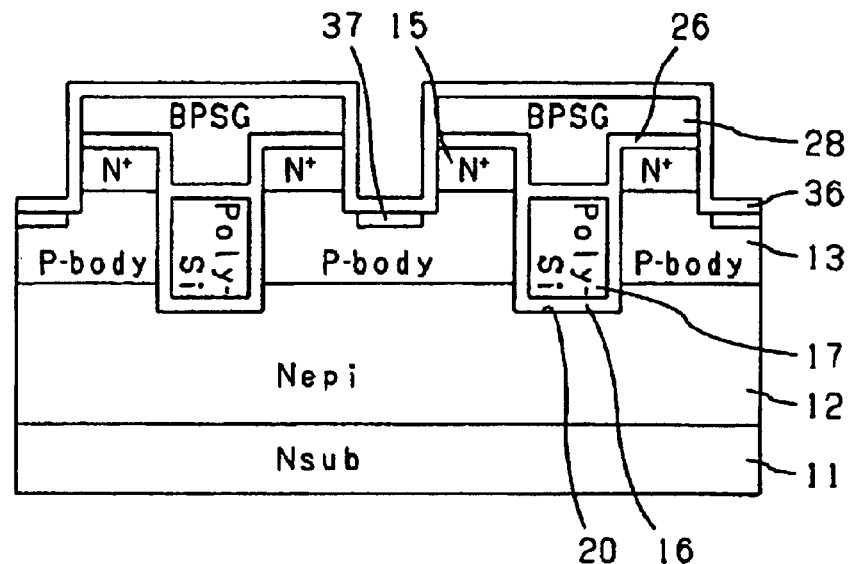
FIG. 27 is a cross-sectional view (f) explaining a manufacturing process of a semiconductor device according to a fifth embodiment of the present invention.
Figure 28:
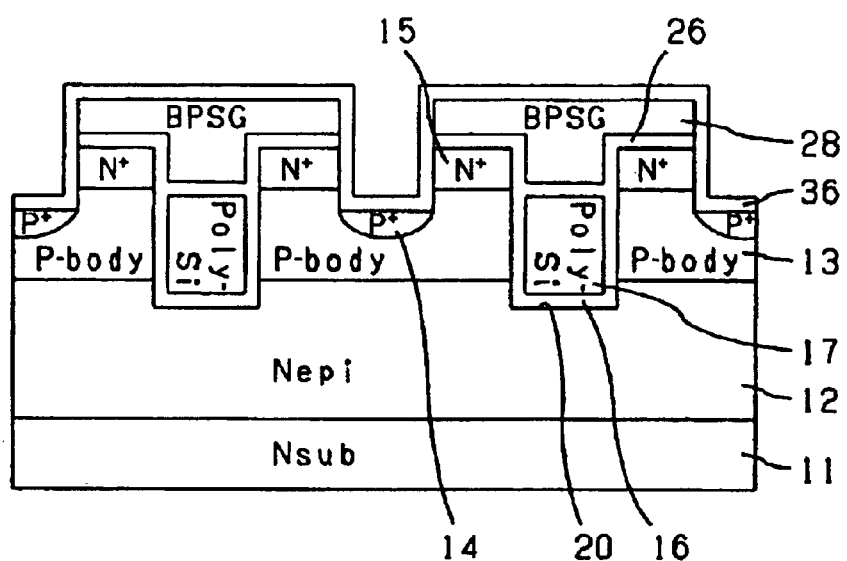
FIG. 28 is a cross-sectional view (g) explaining a manufacturing process of a semiconductor device according to a fifth embodiment of the present invention.
Figure 29:
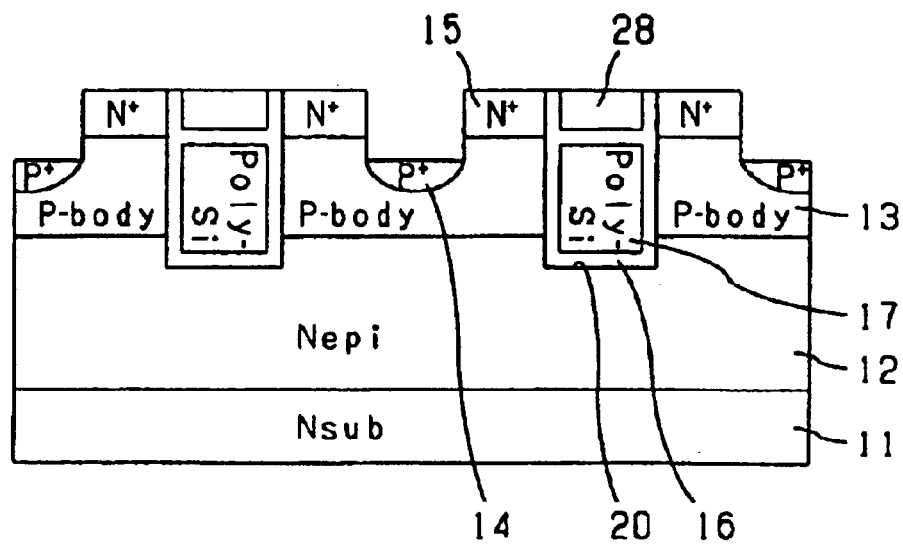
FIG. 29 is a cross-sectional view (h) explaining a manufacturing process of a semiconductor device according to a fifth embodiment of the present invention.

Next, as shown in FIG. 27, boron ions ($B^+$) are injected onto the bottom surface of source trench 21. Moreover, the boron ions are diffused by heating boron ion injection section 37 to form buried $P^+$-type diffusion region 14 as shown in FIG. 28. Furthermore, other ions such as gallium ions may be used instead of boron ions for the injected ions in the same manner as the semiconductor device according to the first embodiment. As shown in FIG. 29, together with removing silicon oxide film 36 by etching, BPSG film 28 formed outside gate trench 20 is also removed. Next, source electrode film 19 shown in FIG. 7 is formed by sputtering on the surface of BPSG film 28 and on the surface of source trench 21. Finally, drain electrode film 25 shown in FIG. 7 is formed by sputtering on the other side of $N^+$-type silicon substrate 11.

Moreover, an explanation is provided of a semiconductor device according to a seventh embodiment of the present invention. FIG. 8 is a cross-sectional view showing a semiconductor device according to a seventh embodiment of the present invention. In the figure, reference symbol 29 indicates a BPSG film. Other reference symbols indicate the same constituents as those shown in FIG. 1.

In a semiconductor device according to a seventh embodiment of the present invention, insulating film 26 and BPSG film 29 are formed recessed into gate trench 20. Accordingly, the contact area between $N^+$-type source region 15 and source electrode film 19 can be enlarged. Furthermore, constituents other than the inside of gate trench 20 and its periphery are the same as those shown in FIG. 1.

Moreover, an explanation is provided of the manufacturing process of a semiconductor device according to a seventh embodiment of the present invention. FIGS. 30 through 37 are cross-sectional views explaining the manufacturing process of a semiconductor device according to a seventh embodiment of the present invention (a) through cross-sectional views explaining the manufacturing process of a semiconductor device according to a seventh embodiment of the present invention (h). In these figures, reference symbol 39 indicates a silicon oxide film, and 40 a boron ion injection section. Other reference symbols indicate the same constituents as those shown in FIGS. 23 through 30.

Figure 30:
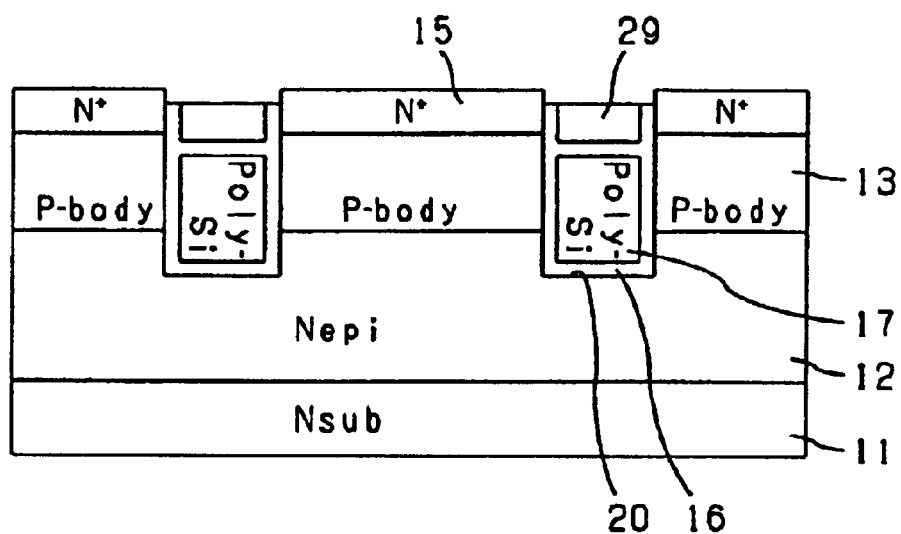
FIG. 30 is a cross-sectional view (a) explaining a manufacturing process of a semiconductor device according to a sixth embodiment of the present invention.
Figure 31:
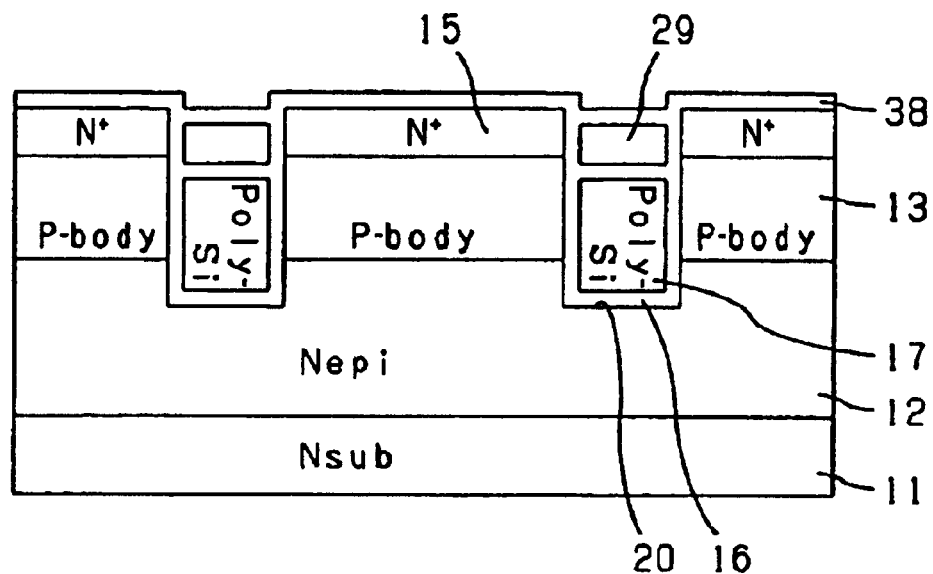
FIG. 31 is a cross-sectional view (b) explaining a manufacturing process of a semiconductor device according to a sixth embodiment of the present invention.

In the manufacturing process of a semiconductor device according to a seventh embodiment of the present invention, following the steps shown in the previously mentioned FIGS. 22 and 23, as shown in FIG. 30, the film equivalent to insulating film 26 of FIG. 23 and BPSG film 29 are etched. At this time, BPSG film 29 is made to be in a state in which it is sunk into gate trench 20. Next, as shown in FIG. 31, insulating film 26 is formed on N$^+$-type source region 15, exposed gate insulating film 16 and the surface of gate electrode film 17.

Figure 32:
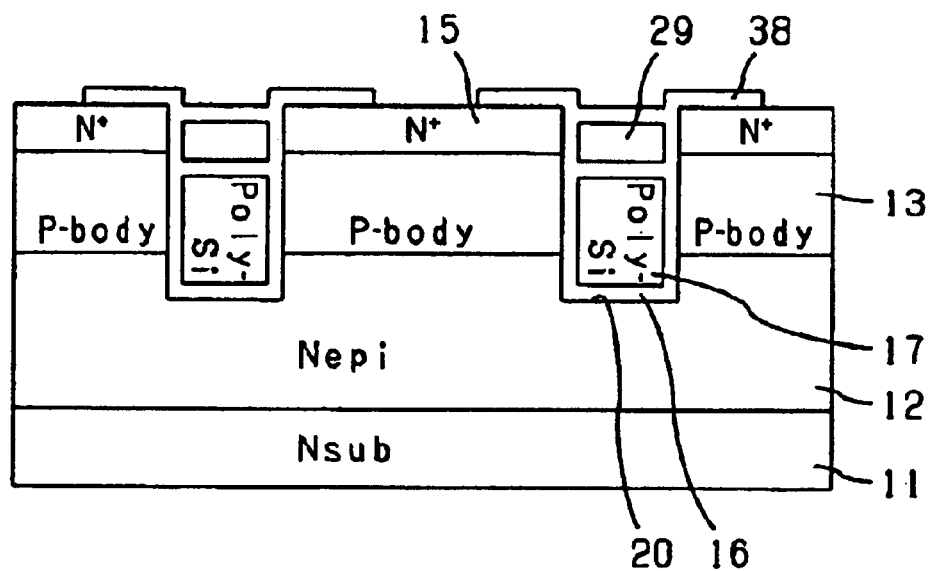
FIG. 32 is a cross-sectional view (c) explaining a manufacturing process of a semiconductor device according to a sixth embodiment of the present invention.
Figure 33:
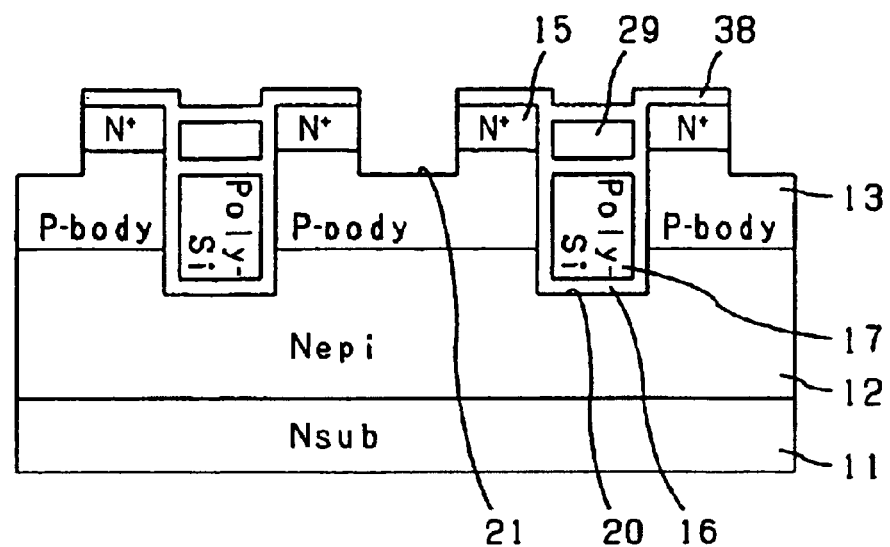
FIG. 33 is a cross-sectional view (d) explaining a manufacturing process of a semiconductor device according to a sixth embodiment of the present invention.
Figure 34:
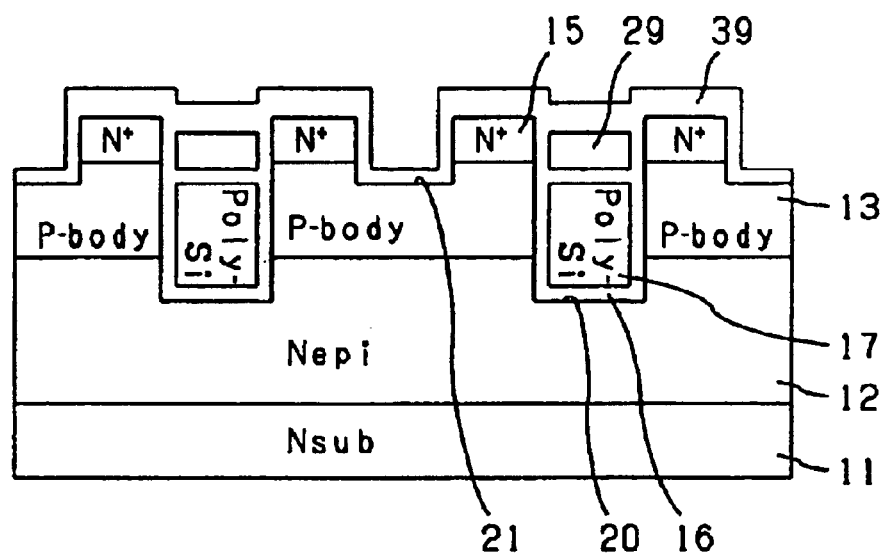
FIG. 34 is a cross-sectional view (e) explaining a manufacturing process of a semiconductor device according to a sixth embodiment of the present invention.

Next, as shown in FIG. 32, a predetermined site in insulating film 26 is opened by etching. As shown in FIG. 33, etching is performed until P-type body layer 13 is reached using insulating film 26 as a mask to form source trench 21. Next, as shown in FIG. 34, silicon oxide film 39 is deposited and formed on insulating film 26 and the surface of source trench 21 by CVD.

Figure 35:
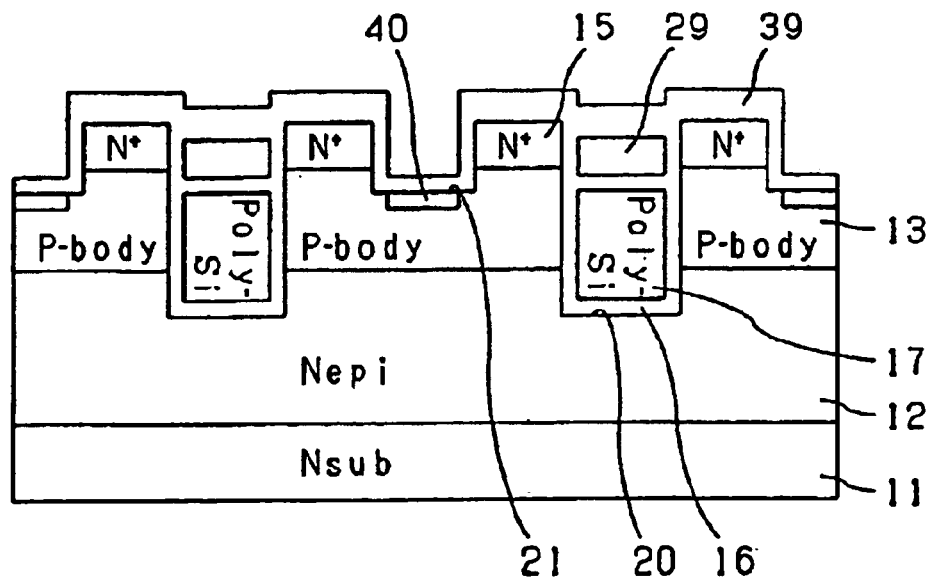
FIG. 35 is a cross-sectional view (f) explaining a manufacturing process of a semiconductor device according to a sixth embodiment of the present invention.
Figure 36:
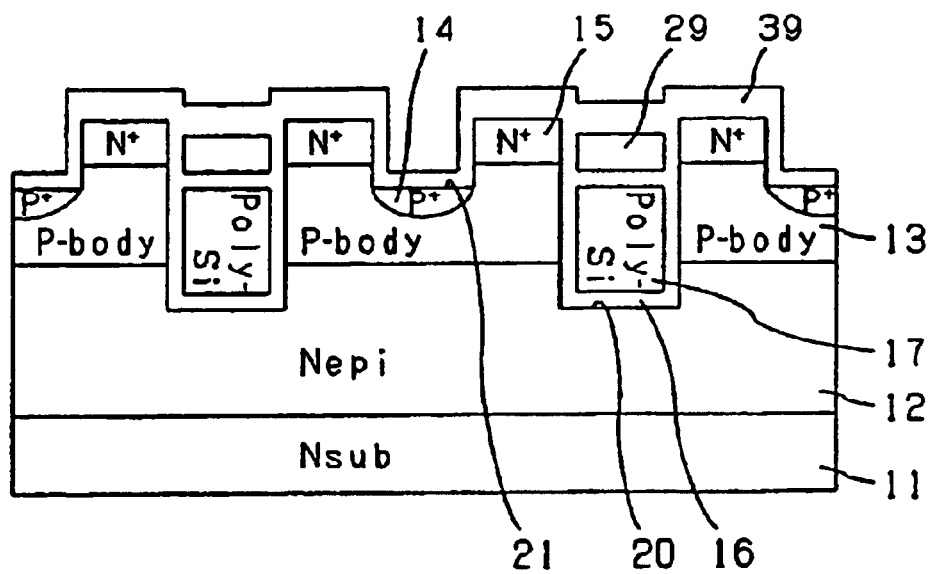
FIG. 36 is a cross-sectional view (g) explaining a manufacturing process of a semiconductor device according to a sixth embodiment of the present invention.
Figure 37:
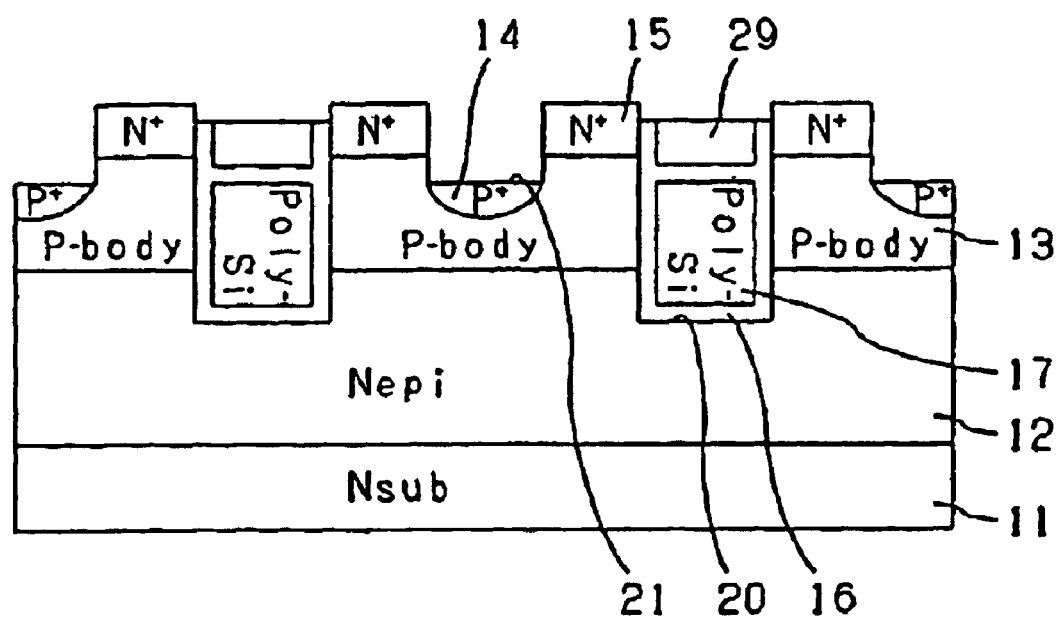
FIG. 37 is a cross-sectional view (h) explaining a manufacturing process of a semiconductor device according to a sixth embodiment of the present invention.
Figure 38A:
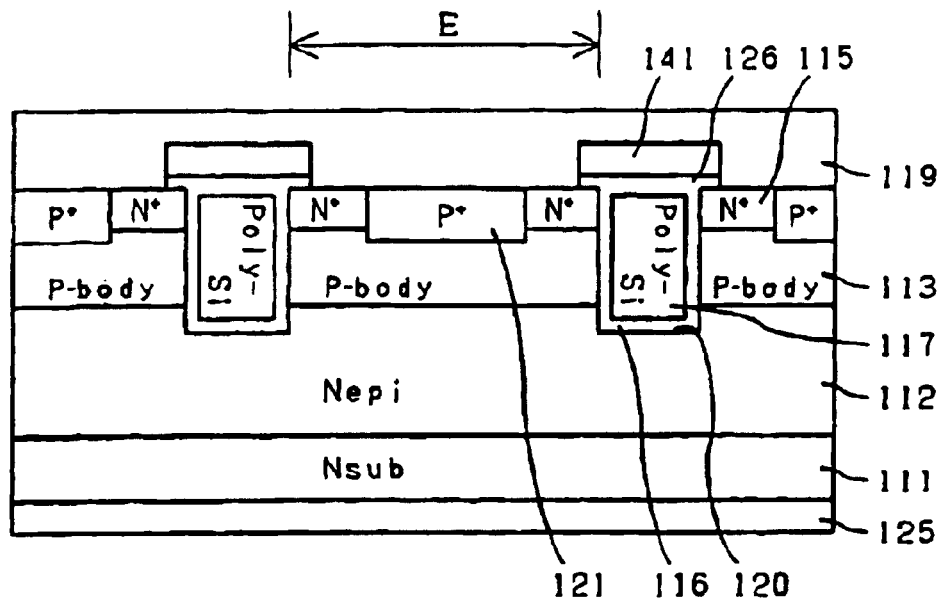
FIGS. 38A and 38B are explanatory views showing an example of a semiconductor device having the constitution of a power MOSFET according to the prior art, with 38A showing an example of a semiconductor device having a gate trench, and 38B showing an example of a semiconductor device having a gate trench and a source trench.
Figure 38B:
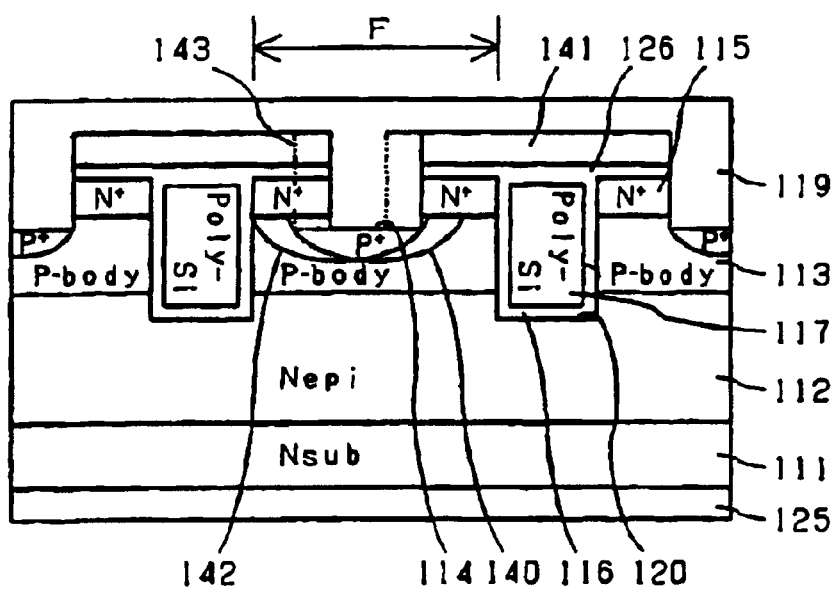

Next, as shown in FIG. 35, boron ions (B$^+$) are injected onto the bottom surface of source trench 21. Next, boron ions are diffused by heating boron ion injection section 40 to form buried P$^+$-type diffusion region 14 as shown in FIG. 36. As shown in FIG. 37, together with removing silicon oxide films 36 and 39 by etching, the other sections of BPSG film 29 except for the portion formed inside gate trench 20 are also removed. Next, source electrode film 19 shown in FIG. 9 is formed by sputtering on the surface of BPSG film 29 and the surface of source trench 21. Finally, drain electrode film 25 shown in FIG. 9 is formed by sputtering on the other side of N$^+$-type silicon substrate 11.

Furthermore, in the semiconductor devices according to each of the aforementioned embodiments, all or a portion of the silicon oxide film formed as an insulating film can be formed with a silicon nitride film. In addition, a metal film can be used instead of a polysilicon film for gate electrode film 17. Moreover, a phosphosilicate glass (PSG) film may be used instead of BPSG film 18. In addition, although the example of the constitution of an N channel trench gate-type power MOSFET was used an example in the semiconductor devices in each of the aforementioned embodiments, the present invention can be similarly applied in the case of P channel trench gate-type power MOSFET as well. Moreover, the semiconductor devices according to each of these embodiments can be preferably applied to not only a semiconductor device having the constitution of a trench gate-type power MOSFET, but also to, for example, that having the constitution of an IGBT. In addition, the present invention can also be preferably applied to the case of using a silicon carbide (SiC) substrate or various other types of substrates instead of a silicon substrate.

INDUSTRIAL APPLICABILITY

As has been described above, the present invention forms a buried diffusion region exposed on the bottom surface of a second trench to a width that is equal to or narrower than the width of the opening of the second trench, and a buried diffusion region in which the buried diffusion region has diffused beyond that which is necessary in the manufacturing step of a semiconductor device can be prevented from contacting a first trench in the vicinity of said buried diffusion region even in the case the accuracy of the photographic step of the formation of the first or second trench is not so high.

What is claimed is:

1. A semiconductor device comprising:
   a first conductive layer of a first conductivity type,
   a first conductivity type of drain layer formed so as to be laminated on a surface of the first conductive layer,
   a second conductivity type of second conductive layer of an opposite type from the first conductivity type formed so as to be laminated on a surface of the drain layer,
   a first conductivity type of source region formed over a range extending from a surface of the second conductive layer to a predetermined depth,
   a first trench formed so as to reach the drain layer by opening the source region,
   a second trench formed by opening the source region,
   a gate insulating film formed on a surface of the first trench,
   a gate electrode film formed on an inner surface of the gate insulating film,
   a source electrode film formed at least on a surface of the second trench, and
   a second conductivity type of buried diffusion region formed within the second conductive layer, exposed on a bottom surface of the second trench, and to a width that is equal to or narrower than a width of the opening of the second trench,
   wherein the second trench is formed to have an indentation in its bottom surface.

2. A semiconductor device according to claim 1 wherein, the second trench is formed so as to reach to the second conductive layer.

3. A power MOSFET device comprising a semiconductor device according to claim 1.

4. A power supply device comprising a semiconductor device according to claim 1.

5. A DC-DC converter comprising a semiconductor device according to claim 1.

6. A semiconductor device comprising:
   a first conductive layer of a first conductivity type;
   a drain/source layer of the first conductivity type formed on a surface of the first conductive layer;
   a second conductive layer of a second conductivity type opposite from the first conductivity type formed on a surface of the drain/source layer;
   a source/drain region of the first conductivity type formed to a specified depth in the second conductive layer;
   a buried diffusion region of the second conductivity type formed within the second conductive layer;
   a first trench formed in the source/drain region and reaching the drain/source layer;
   a gate insulating film formed in the first trench;
   a gate electrode film formed on the gate insulating film;
   a second trench formed in the source/drain region, wherein the second trench includes a first trench portion having a first width and a second trench portion formed in the bottom of the first trench portion having a second width, the second trench portion reaches the buried diffusion region, and the width of the buried diffusion region is no more than the first width; and
   a source electrode film formed in the second trench.

7. The semiconductor device according to claim 6, wherein the first conductive layer is an N-type substrate.

8. The semiconductor device according to claim 6, wherein the drain/source layer comprises an N-type epitaxial layer.

9. The semiconductor device according to claim 6, further comprising:

a drain electrode formed on a surface of the first conductive layer opposite the surface on which the drain/source layer is formed.

10. The semiconductor device according to claim 6, further comprising:

one or more insulating layers formed above the first trench.

11. The semiconductor device according to claim 10, wherein one of the one or more insulating layer comprises boro-phosphosilicate glass (BPSG).

12. A power MOSFET device comprising a semiconductor device according to claim 6.

13. A power supply device comprising a semiconductor device according to claim 6.

14. A DC-DC converter comprising a semiconductor device according to claim 6.

15. A semiconductor device comprising:

a substrate of a first conductivity type;

a drain/source layer of the first conductivity type formed on a surface of the substrate;

a conductive layer of a second conductivity type opposite from the first conductivity type formed on a surface of the drain/source layer;

a source/drain region of the first conductivity type formed to a specified depth in the conductive layer;

buried diffusion regions of the second conductivity type formed within the conductive layer;

gate trenches formed in the source/drain region and reaching the drain/source layer;

gate insulating films formed in the gate trenches;

gate electrode films formed on the gate insulating films;

source trenches formed in the source/drain region between adjacent gate trenches, wherein each source trench includes a first trench portion having a first width and a second trench portion formed in the bottom of the first trench portion having a second width, the second trench portion reaches a respective one of the buried diffusion regions, and the width of the respective buried diffusion region is no more than the first width; and a source electrode film formed in the source trench.

16. The semiconductor device according to claim 15, wherein the substrate comprises an N-type substrate.

17. The semiconductor device according to claim 15, wherein the drain/source layer comprises an N-type epitaxial layer.

18. The semiconductor device according to claim 15, further comprising:

a drain electrode formed on a surface of the substrate opposite the surface on which the drain/source layer is formed.

19. A power MOSFET device comprising a semiconductor device according to claim 15.

20. A power supply device comprising a semiconductor device according to claim 15.

21. A DC-DC converter comprising a semiconductor device according to claim 15.

* * * * *